United States Patent
Dobashi et al.

(10) Patent No.: US 10,049,899 B2
(45) Date of Patent: Aug. 14, 2018

(54) SUBSTRATE CLEANING APPARATUS

(71) Applicant: Tokyo Electron Limited, Tokyo (JP)

(72) Inventors: Kazuya Dobashi, Yamanashi (JP); Kensuke Inai, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 915 days.

(21) Appl. No.: 14/463,670

(22) Filed: Aug. 20, 2014

(65) Prior Publication Data
US 2015/0052702 A1 Feb. 26, 2015

(30) Foreign Application Priority Data

Aug. 20, 2013 (JP) .................. 2013-170784

(51) Int. Cl.
*A47L 5/38* (2006.01)
*H01L 21/67* (2006.01)
*H01L 21/02* (2006.01)

(52) U.S. Cl.
CPC .. *H01L 21/67028* (2013.01); *H01L 21/02057* (2013.01); *A47L 5/38* (2013.01)

(58) Field of Classification Search
CPC . H01L 21/67028; H01L 21/02057; A47L 5/38
USPC .......................................................... 15/303
See application file for complete search history.

(56) References Cited

U.S. PATENT DOCUMENTS

2014/0227882 A1  8/2014  Inai et al.

FOREIGN PATENT DOCUMENTS

| JP | H01-099676 A | 4/1989 |
|---|---|---|
| JP | 1995-153729 | 6/1995 |
| JP | H11-260779 A | 9/1999 |
| JP | 2007-207810 A | 8/2007 |
| JP | 2013-026327 | 2/2013 |
| KR | 10-2012-0112242 A | 10/2012 |
| KR | 10-2012-0135423 A | 12/2012 |

OTHER PUBLICATIONS

Thomas, Wayne; Cleaning Cevice for Solid Surface; Abstract of JP 1995-153729; Jun. 16, 1995; http://www19.ipdl.inpit.go.jp/.
Inouchi, Kensuke; Cleaning Method, Cleaning Apparatus and Storage Medium; Abstract of JP 2013-026327; Feb. 4, 2013; http://www19.ipdl.inpit.go.jp/.

*Primary Examiner* — David Redding

(57) ABSTRACT

A substrate cleaning apparatus for removing particles adhered to a substrate includes a cleaning chamber for cleaning a substrate under a vacuum atmosphere, a mounting unit, provided in the cleaning chamber, for mounting the substrate thereon. The substrate cleaning apparatus further includes a nozzle unit for injecting a cleaning gas from an area of a higher pressure than an atmosphere in which the substrate is mounted toward the substrate in the cleaning chamber, generating a gas cluster as an aggregate of atoms or molecules of the cleaning gas by adiabatic expansion and irradiating the gas cluster to the substrate in a direction perpendicular thereto, a gas exhaust port for evacuating the cleaning chamber, and a moving unit for relatively moving the mounting unit and the nozzle unit.

4 Claims, 25 Drawing Sheets

SUBSTRATE CLEANING APPARATUS

CROSS-REFERENCE TO RELATED APPLICATION

This application claims priority to Japanese Patent Application No. 2013-170784 filed on Aug. 20, 2013, the entire contents of which are incorporated herein by reference.

FIELD OF THE INVENTION

The present invention relates to a technique for cleaning a surface of a substrate by irradiating a gas cluster on the substrate.

BACKGROUND OF THE INVENTION

In a semiconductor manufacturing apparatus, a product yield is greatly affected by adhesion of particles to a substrate during a manufacturing process. To that end, the substrate is cleaned before or after the processing. However, it is desired to develop a cleaning technique for simply and reliably removing particles while suppressing damage to the substrate. Japanese Patent Application Publication No. 2013-0026327 discloses a technique for removing an unnecessary portion by irradiating a gas cluster to, e.g, a needle-shaped crystal portion formed at a peripheral portion of a substrate from a central side toward a peripheral side of the substrate while rotating the substrate that has been subjected to dry etching. The gas cluster is an aggregate of atoms or molecules obtained by injecting a high-pressure gas in vacuum and cooling the gas to a condensation temperature by adiabatic expansion.

Meanwhile, the semiconductor manufacturing apparatus requires reduction of a foot print and scaling down of a module. A substrate cleaning apparatus using a gas cluster also requires scaling down of a module.

Japanese Patent Application Publication No. 1995-153729 discloses a cleaning device for cleaning a substrate by spraying aerosol toward the substrate. In this cleaning device, nozzles are arranged such that aerosol spray positions are disposed side by side in one row. The aerosol is slantingly sprayed to the entire surface of the substrate, and the substrate is moved across the aerosol spray area. However, in order to scan the aerosol spray area over the entire surface of the substrate, it is required to ensure a space corresponding to at least two substrates in a substrate moving direction.

Further, since the aerosol is slantingly sprayed, a pattern formed on a wafer may collapse.

SUMMARY OF THE INVENTION

In view of the above, the present invention provides a technique capable of suppressing collapse of a pattern on a substrate in the case of removing particles by irradiating a gas cluster to a surface of the substrate.

The present invention also provides a technique capable of contributing to scaling down of a substrate cleaning apparatus.

In accordance with a first aspect of the present invention, there is provided a substrate cleaning apparatus for removing particles adhered to a substrate, including: a cleaning chamber configured to perform a cleaning process on the substrate under a vacuum atmosphere; a mounting unit, provided in the cleaning chamber, for mounting the substrate thereon; at least one nozzle unit configured to eject a cleaning gas toward the substrate in the cleaning chamber, generate a gas cluster as an aggregate of atoms or molecules of the cleaning gas by adiabatic expansion and irradiate the gas cluster to the substrate in a direction perpendicular to the substrate; a gas exhaust port through which the cleaning chamber is evacuated; and a moving unit configured to move the mounting unit and the at least one nozzle unit relative to each other.

In accordance with a second aspect of the present invention, there is provided a substrate cleaning apparatus for removing particles adhered to a substrate, including: a cleaning chamber configured to perform a cleaning process on the substrate under a vacuum atmosphere; a mounting unit, provided in the cleaning chamber, for mounting the substrate thereon; at least one nozzle unit configured to ejecting a cleaning gas toward the substrate in the cleaning chamber, generate a gas cluster as an aggregate of atoms or molecules of the cleaning gas by adiabatic expansion and irradiate the gas cluster to the substrate in a direction perpendicular to the substrate; a gas exhaust port through which the cleaning chamber is evacuated; and a driving unit configured to move the mounting unit in an X and a Y direction perpendicular to each other and a horizontal plane, wherein the at least one nozzle unit is assigned to each of divided areas obtained by dividing a square including an entire cleaning target surface of the substrate and having four sides extending in the X and the Y direction into a plurality of parts, and a horizontal position relationship between each of the divided area and the at least one nozzle unit therein is the same.

In accordance with a third aspect of the present invention, there is provided a substrate cleaning apparatus for removing particles adhered to a substrate including: a cleaning chamber configured to perform a cleaning process on the substrate under a vacuum atmosphere; a mounting unit, provided in the cleaning chamber, for mounting the substrate thereon; at least one nozzle unit configured to eject a cleaning gas toward the substrate in the cleaning chamber, generate a gas cluster as an aggregate of atoms or molecules of the cleaning gas by adiabatic expansion and irradiate the gas cluster to the substrate in a direction perpendicular or substantially perpendicular to the substrate; a gas exhaust port through which the cleaning chamber is evacuated; and a moving unit configured to move the mounting unit and the nozzle unit relative to each other; and a control unit configured to control movement of the mounting unit and supply the at least one nozzle unit with the gas cluster, wherein each nozzle unit is assigned to at least one of divided areas obtained by dividing a cleaning target surface of the substrate into equal parts by at least one straight line passing through a rotation center of the substrate; and the control unit is configured to output a control signal for allowing the divided area to which the at least one nozzle unit is assigned to be entirely irradiated with the cleaning gas by the at least one nozzle unit by moving the substrate in an X and a Y direction, and rotate the substrate such that at least one of the other divided areas is subsequently positioned to correspond to the nozzle unit, and allow the subsequent divided area to be irradiated with the cleaning gas by the nozzle unit.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Hereinafter, embodiments of the present invention will be described in detail with reference to the accompanying drawings which form a part hereof.

Figure 1:
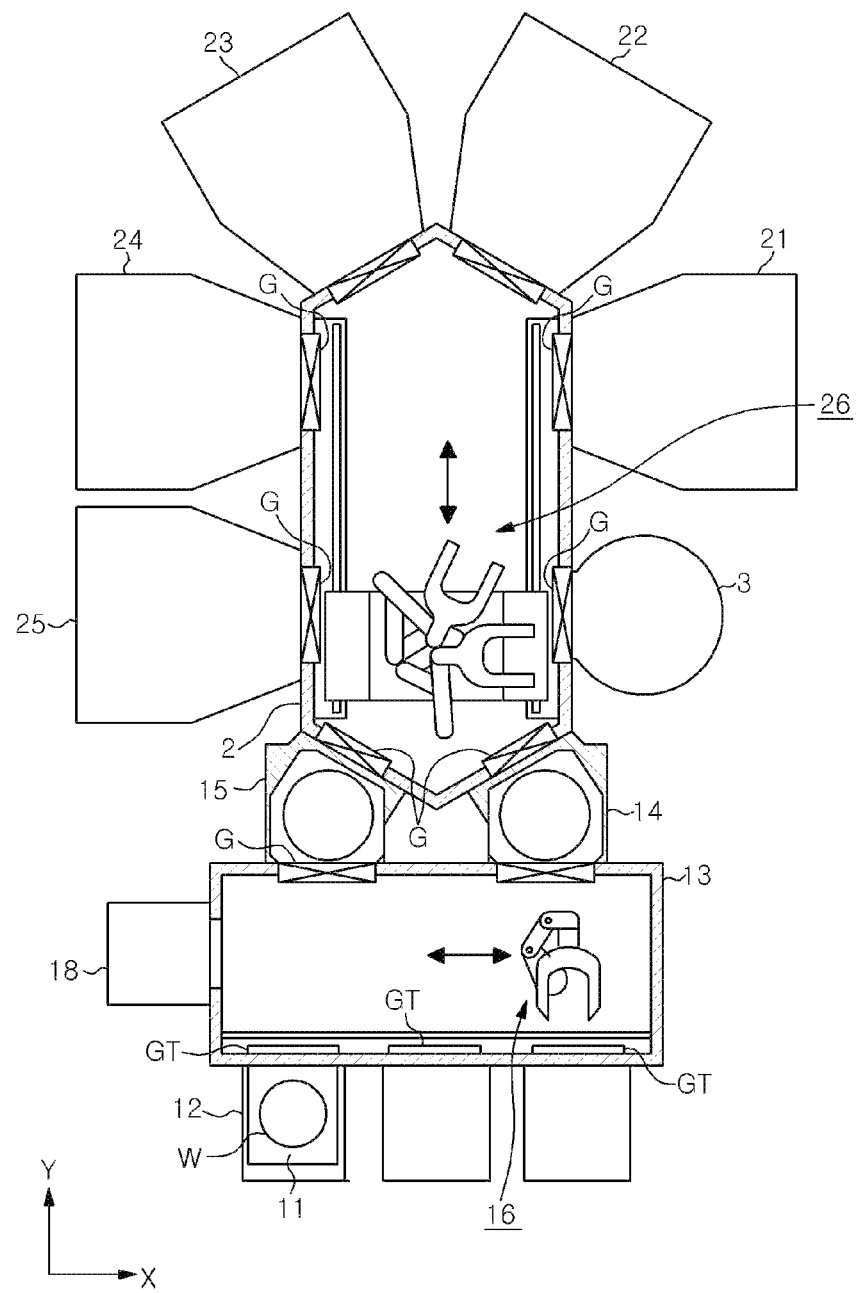
FIG. 1 is a top view schematically showing a configuration of a vacuum processing apparatus in accordance with an embodiment of the present invention.

A vacuum processing apparatus provided with a cleaning apparatus for implementing a substrate cleaning method in accordance with a first embodiment of the present invention will be described. FIG. 1 is a top view showing an overall configuration of a multi chamber type vacuum processing apparatus. In the vacuum processing apparatus, a loading/unloading port 12 for mounting thereon a FOUP (front opening unified pod) 11 that is an airtight transfer container accommodating therein, e.g., 25 semiconductor wafers (hereinafter, referred to as "wafer") W as substrates is provided, e.g., at three locations. An atmospheric transfer chamber 13 is provided along the arrangement of the loading/unloading ports 12, and a gate door GT that is opened/closed together with a cover of the FOUP 11 is provided at a front wall of the atmospheric transfer chamber 13. Two load-lock chambers 14 and 15 are airtightly connected to a rear wall of the atmospheric transfer chamber 13 which is opposite to the front wall. The load-lock chambers 14 and 15 include vacuum pumps and leakage valves (not shown) and thus can be switched between a normal pressure atmosphere and a vacuum atmosphere. Further, a reference numeral G denotes a gate valve.

A first substrate transfer unit 16 for transferring a wafer W is provided in the atmospheric transfer chamber 13. Further, an alignment chamber 18 for adjusting orientation and eccentricity of the wafer is provided at a left wall of the atmospheric transfer chamber 13 when seen from the front side toward the rear side of the atmospheric transfer chamber 13. The first substrate transfer unit 16 transfers a wafer W between the FOUPs 11, the load-lock chambers 14 and 15, and the alignment chamber 18. The first substrate transfer unit 16 can move along the arrangement direction (X-axis direction in FIG. 1) of the FOUPs 11 and also can move vertically. Further, the first substrate transfer unit 16 can move back and forth and rotate about the vertical axis.

A vacuum transfer chamber 2 is airtightly connected to the rear side of the load-lock chambers 14 and 15 when seen from the atmospheric transfer chamber 13 side. A cleaning module 3 that is a substrate cleaning apparatus and a plurality of, e.g., five, vacuum processing modules 21 to 25 are airtightly connected to the vacuum transfer chamber 2. The vacuum processing modules 21 to 25 perform, e.g., sputtering or CVD (Chemical Vapor Deposition) for film formation.

The vacuum transfer chamber 2 has a second substrate transfer unit 26 for transferring a wafer W under a vacuum atmosphere. The second substrate transfer unit 26 includes a joint arm that can move back and forth and rotate about a vertical axis. The arm can move in a lengthwise direction (Y-axis direction in FIG. 1). The second substrate transfer unit 26 transfers a wafer W between the load-lock chambers 14 and 15, the cleaning module 3 and the vacuum processing modules 21 to 25.

Next, the cleaning module 3 will be described with reference to FIGS. 2 and 3. The cleaning module 3 includes, e.g., a cylindrical cleaning chamber 31. A transfer port 34 for loading/unloading the wafer W is provided on a side surface of the cleaning chamber 31, and a gate valve 35 for opening/closing the transfer port 34 is provided at the transfer port 34.

A rotating stage 32 on which the wafer W is horizontally mounted is provided at the center of the cleaning chamber 31. The rotating stage 32 is connected to a driving unit 36 through a rotation shaft 33 and can be rotated and vertically moved by the driving unit 36. The rotating stage 32 may be an electrostatic chuck.

Figure 2:
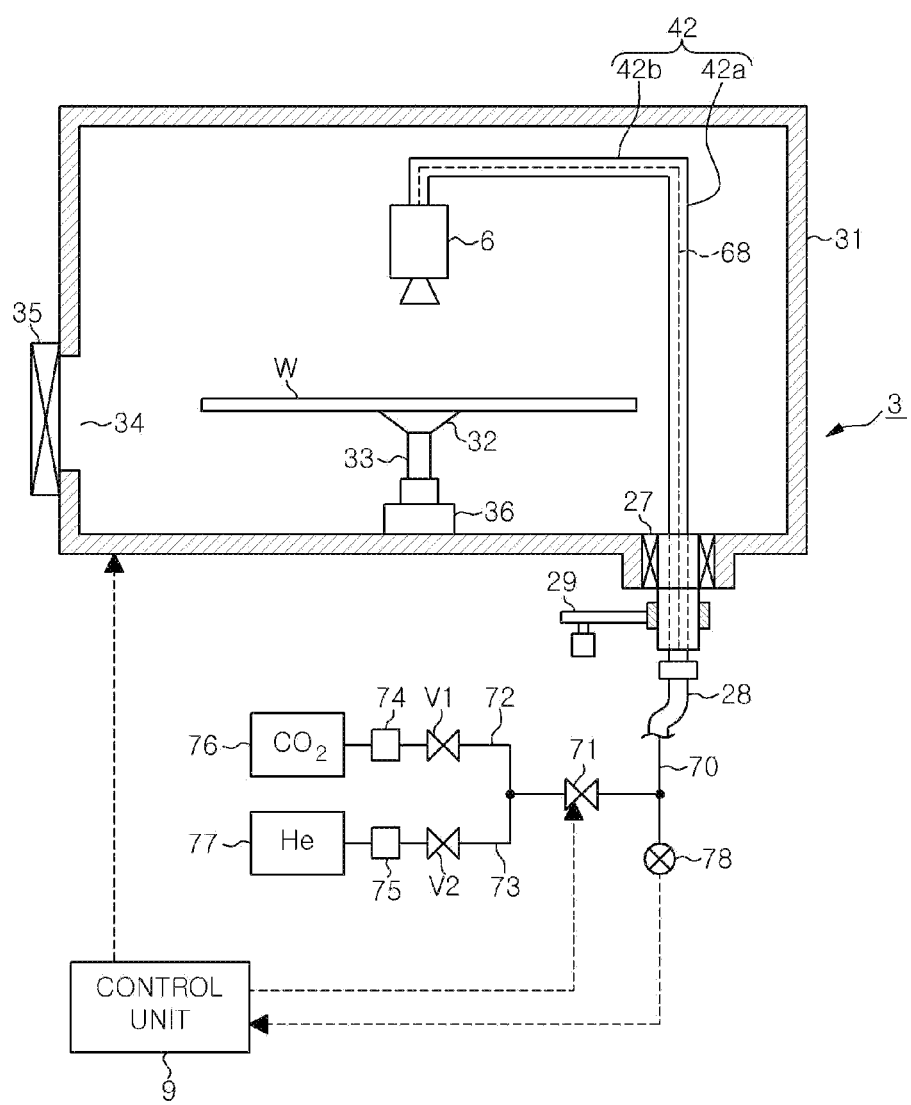
FIG. 2 is a vertical cross sectional view schematically showing a configuration of a substrate cleaning apparatus in accordance with a first embodiment of the present invention.
Figure 3:
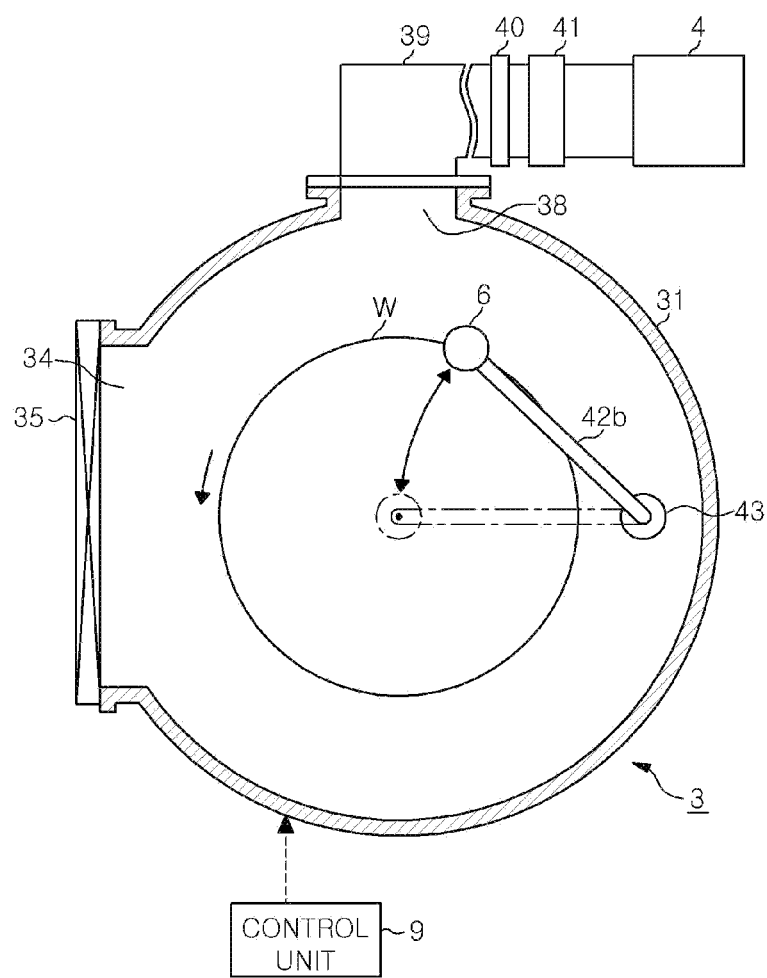
FIG. 3 is a top view schematically showing the configuration of the substrate cleaning apparatus in accordance with the first embodiment of the present invention.

As shown in FIG. 2, a nozzle unit moving body 42 is provided in the cleaning chamber 31 at a rear side of the rotating stage 32 when seen from the transfer port 34 side. The nozzle unit moving body 42 includes a rotating shaft portion 42a extending vertically upward through a bottom surface of the cleaning chamber 31 and a rotating arm 42b which is bent in an L shape at an upper end of the rotating shaft portion 42a to extend toward the rotating stage 32. The rotating shaft portion 42a rotatably penetrates through the bottom portion of the cleaning chamber 31 and is airtightly sealed by a bearing seal portion 27. The nozzle unit moving body 42 is connected to a rotation unit 29 including a pulley, a motor and the like at a bottom portion of the rotating shaft portion 42a.

The nozzle unit 6 for ejecting a cleaning gas in a vertically downward direction and irradiating a gas cluster to the wafer W is provided at a leading end portion of the rotating arm 42b. As shown in FIG. 3, the nozzle unit 6 swivels between a position above the central portion of the wafer W and a position above a left peripheral portion of the wafer W when seen from the transfer port 34 side by the rotation of the rotating arm 42b. Hence, the gas cluster is irradiated to a space between the central portion of the wafer W and the left peripheral portion of the wafer W when seen from the transfer port 34 side.

Figure 4:
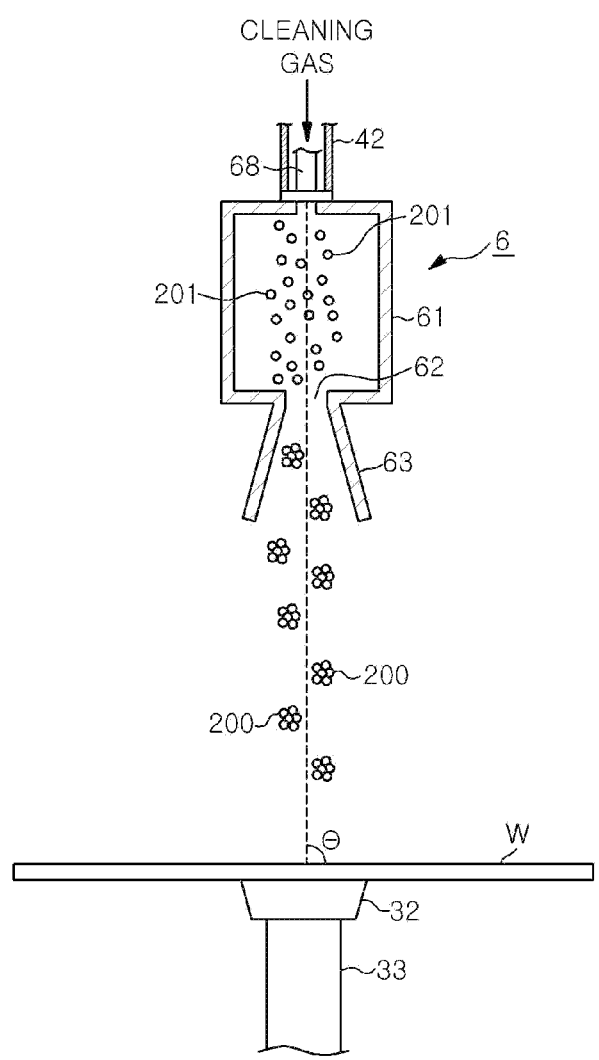
FIG. 4 is a vertical cross sectional view schematically showing an example of a nozzle unit of the substrate cleaning apparatus.

The nozzle unit 6 ejects the cleaning gas with a higher pressure than a processing atmosphere in the cleaning chamber 31 toward the wafer W in the cleaning chamber 31 to generate a gas cluster that is an aggregate of atoms or molecules of the cleaning gas which are obtained by adiabatic expansion. As shown in FIG. 4, the nozzle unit 6 includes an approximately cylindrical pressure chamber 61 with an open lower end. The lower end portion of the pressure chamber 61 is formed as an orifice 62. The gas diffusion portion 63 that is widened downward is connected to the orifice 62. The opening diameter (diameter of the opening) of the orifice 62 is, e.g., about 0.1 mm.

As described above, the nozzle unit 6 irradiates the gas cluster to the surface of the wafer W in a perpendicular direction to the surface of the wafer W. Here, "irradiation in a perpendicular direction" indicates a state in which an angle θ between the central axis in the lengthwise direction of the nozzle unit 6 and the mounting surface of the rotating stage 32 (the surface of the wafer W) is within a range of 90°±15°, as shown in FIG. 4.

As shown in FIG. 4, one end of a pipeline 68 is connected to an upper end portion of the pressure chamber 61. The pipeline 68 extends through the rotating arm 42b and the rotating shaft portion 42a and is connected to one end of a gas supply line 70 through a connecting portion 28 at the outside the cleaning chamber 31 as shown in FIG. 2. The connecting portion 28 allows the pipeline 68 to rotate relative to the gas supply line 70. The other end of the gas supply line 70 is branched into a first and a second gas supply line 72 and 73. A pressure control valve 71 is provided between one end of the gas supply line 70 and the branch point of the first and the second gas supply line 72 and 73. A $CO_2$ gas supply source 76 is connected to an upstream side of the first gas supply line 72 via an opening/closing valve V1 and a flow rate control unit 74. An He gas supply source 77 is connected to the other end of the second gas supply line 73 via an opening/closing valve V2 and a flow rate control unit 75.

Disposed in the gas supply line 70 is a pressure detection unit 78 for detecting a pressure in the gas supply line 70. Based on the detection value of the pressure detection unit 78, an opening degree of the pressure control valve 71 and a gas pressure in the pressure chamber 61 are controlled by a control unit 9 to be described later. The pressure detection unit 78 may detect a pressure in the pressure chamber 61.

The pressure control based on the detection value of the pressure detection unit 78 may be realized by the gas flow rate control in the $CO_2$ gas flow rate control unit 74 and the He gas flow rate control unit 75. Moreover, the pressure control may be realized by the pressure control valve 71 after increasing a gas supply pressure by using a boosting unit such as a gas booster between the pressure control valves 71 and the opening/closing valves V1 and V2. Further, a filter for removing impurities in the gas may be provided.

A gas exhaust port 38 is provided at a left side surface in the cleaning chamber 31 when seen from the transfer port 34 toward the inside of the cleaning chamber 31. The gas exhaust port 38 is connected to one end of a gas exhaust line 39, and the other end of the gas exhaust line 39 is connected to a vacuum pump 4 via a pressure control valve 40, e.g., a butterfly valve or the like, and an opening/closing valve 41. A specific installation position of the gas exhaust port 38 will be described later.

The cleaning module 3 further includes the control unit 9. The control unit 9 is formed of, e.g., a computer including a program, a memory and a CPU. The program has steps for executing a series of operations for cleaning a wafer W by a cleaning module, such as exhaust of the cleaning chamber, discharge of a cleaning gas and the like. The program is stored in a computer storage medium, e.g., a compact disk, a hard disk, a magneto-optical disk or the like, and installed in the control unit 9.

Hereinafter, the overall processing of the wafer W by the vacuum processing apparatus will be described briefly. When the FOUP 11 is mounted on the loading/unloading port 12, a wafer W is taken out from the FOUP 11 by the first substrate transfer unit 16. The wafer W has, e.g., an interlayer insulating film. The interlayer insulating film has a pattern, e.g., recesses for filling a copper wiring (groove and via hole).

The wafer W taken out from the FOUP 11 is transferred to the alignment chamber 18 via the atmospheric transfer chamber 13 and subjected to alignment. Next, the wafer W is transferred to the load-lock chamber 14 or 15 by the first substrate transfer unit 16 and transferred to the cleaning module 3 by the second substrate transfer unit 26, and then subjected to particle removal treatment.

The wafer W that has been subjected to the particle removal treatment by the cleaning module 3 is transferred to one of the vacuum processing modules 21 to 25 by the second substrate transfer unit 26 and subjected to formation of a barrier layer or CVD treatment. Thereafter, the wafer W is returned to the original FOUP 11 on the loading/unloading port 12 via the vacuum transfer chamber 2, the load-lock chamber 14 or 15 and the atmospheric transfer chamber 13 in that order.

Figure 5:
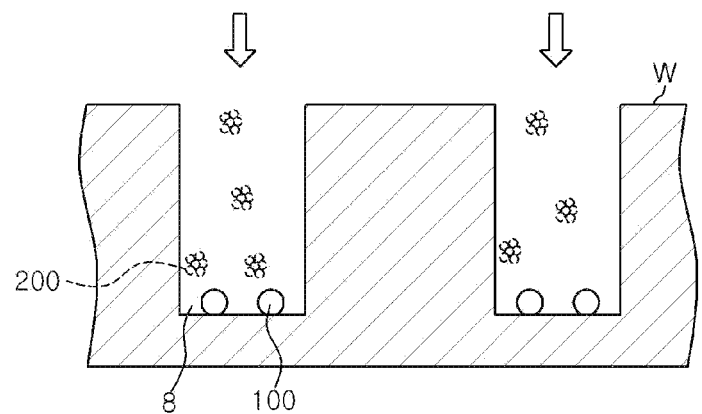
FIG. 5 is a diagram for explaining recesses on a surface of a substrate.

Next, an operation of the cleaning module 3 in accordance with an embodiment of the present invention will be described. The wafer W is loaded into the cleaning module 3 by the second substrate transfer unit 26 and the rotation stage 32 is moved up to receive the wafer W. Then, the wafer W is mounted on the rotation stage 32, and the nozzle unit 6 is positioned above the central portion of the wafer W. By rotating the rotating arm 42b with the central portion of the wafer W set as the gas cluster irradiation starting position, the irradiation position is shifted toward the peripheral side of the wafer W while irradiating the gas cluster. At this time, the wafer W is rotated at a rotation speed of, e.g., 20 rpm to 200 rpm, by the rotating stage 32. The irradiation position may be continuously shifted from the central portion toward the peripheral portion of the wafer W, or may be sequentially and intermittently shifted from the central portion toward the peripheral portion of the wafer W. In the latter case, for example, the nozzle unit 6 is intermittently moved such that the irradiation positions are slightly overlapped in a diametrical direction of the wafer W during single rotation of the wafer W. Further, the stop time at each irradiation position is set to be longer than a time required for single rotation of the wafer W. By controlling the moving speed of the nozzle unit 6 and the rotation speed of the wafer W, the gas cluster is irradiated to all the divided areas of the wafer W, e.g., the entire surface of the wafer W Next, the generation of gas cluster and the removal of particles will be described. The flow rates of $CO_2$ gas and He gas are controlled to predetermined levels by the flow rate control units 74 and 75. The pressure control valve 71 and the opening/closing valves V1 and V2 are opened, and a gaseous mixture of $CO_2$ gas and He gas is supplied to the nozzle unit 6. When $CO_2$ gas is supplied from the nozzle unit 6 where the pressure is high to a processing atmosphere in the cleaning chamber 31 where the pressure is low, $CO_2$ gas is cooled to a level lower than a condensation temperature by abrupt adiabatic expansion. Therefore, as shown in FIG. 4, molecules 201 are bonded together by Van der Waals force, thereby forming a gas cluster 200 that is an aggregate of the molecules 201. The gas cluster 200 is irradiated from the nozzle unit 6 toward the wafer W in a perpendicular direction to the wafer W and introduced into the recesses 8 for a circuit pattern of the wafer W as shown in FIG. 5. The particles 100 in the recesses 8 are removed by the gas cluster or molecules of the gas cluster which are decomposed by collision with the wafer W.

The mixture of $CO_2$ gas and He gas can be controlled by the $CO_2$ gas flow rate control unit 74 and the He gas flow rate control unit 75. For example, they are mixed at a mixing ratio of 1:9. In the case of generating a gas cluster by $CO_2$ gas mixed with He gas, the ejection speed of the gas cluster can be increased. Accordingly, a high-energy gas cluster can be obtained, which is preferable. As for a gas for generating a gas cluster, it is possible to use an inert gas such as Ar gas, $N_2$ gas, $SF_6$ or $CF_4$.

Meanwhile, a width of protrusions between the adjacent recesses on the wafer W is considerably small due to high integration of the circuit. Since, however, the gas cluster is irradiated in a perpendicular direction to the surface of the wafer W, the collapse of the protrusions, i.e., so-called pattern collapse, is suppressed.

The particle removal treatment (cleaning treatment) using the gas cluster is performed on the entire surface of the wafer W by the above-described rotation of the nozzle unit 6. As a consequence, the particles 100 adhered to the surface of the wafer W are removed and discharged through the gas exhaust port 38 together with the gas in the cleaning chamber 31.

Figure 6:
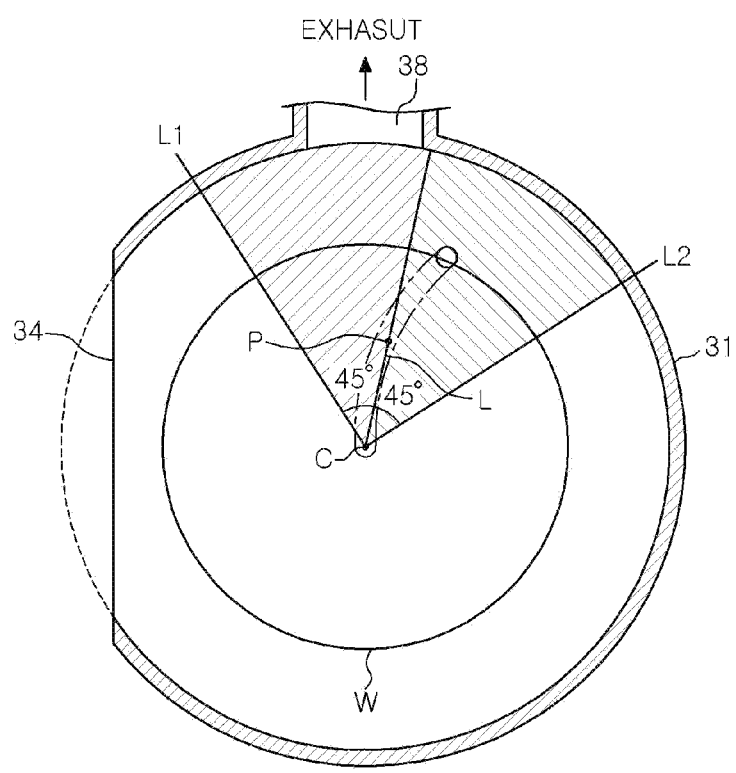
FIG. 6 is a diagram for explaining an installation position of a gas exhaust line.

Here, the installation position of the gas exhaust port 38 (opening in a base end portion of the gas exhaust line 39 that is opened toward the inside of the cleaning chamber 31) will be described with reference to FIG. 6. When the nozzle unit 6 is moved between the position above the central portion and the position above the peripheral portion of the wafer W, the irradiation area forms a circular arc shape. A notation P shown in FIG. 6 denotes a central portion of an irradiation area (surrounded by a chain line). A notation C in the FIG. 6 denotes the center of the cleaning chamber 31 when seen from the top. In this example, the cleaning chamber 31 has a circular shape when seen from the top, so that the center C of the cleaning chamber 31 is the center of the circle. The transfer port 34 for the wafer in the cleaning chamber 31 is indicated as a chord of the circle which is a straight line. The center C is the center of the circle without considering the chord (a part of the circle is indicated by a dotted line in FIG. 6).

Preferably, when drawing a straight line L extending seen from the center C of the cleaning chamber 31 through the central portion P of the irradiation area to the side wall of the cleaning chamber 31, the gas exhaust port 38 is installed in an area between straight lines L1 and L2 obtained by rotating the straight line L at an angle of 45° leftward and rightward about the center C of the cleaning chamber 31.

Figure 7:
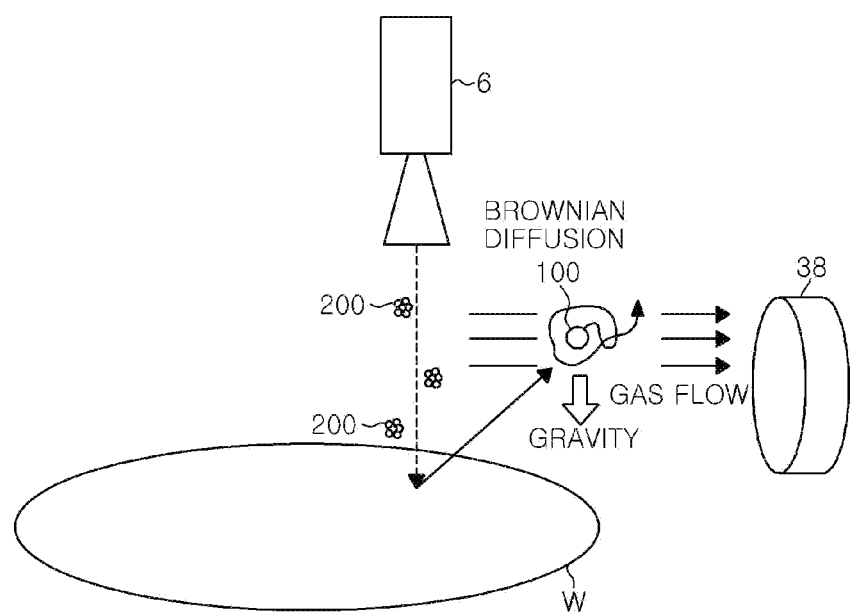
FIG. 7 is a diagram for explaining a force related to movement of particles scattered from a wafer.

The movement of the particles 100 in the case of irradiating the gas cluster to the wafer W will be described before explaining the reason for determining the position of the gas exhaust port 38. The moving direction of the particles 100 scattering in the cleaning chamber 31 is determined by a gas flow directed toward the gas exhaust port 38 in the cleaning chamber 31, gravity and movement in a direction by Brownian diffusion as shown in FIG. 7.

The cleaning chamber 31 is in a vacuum state before the irradiation of the gas cluster, and a gas density is low. Therefore, even if the gas in the cleaning chamber 31 is exhausted through the gas exhaust port 38, a strong gas flow is hardly formed in the cleaning chamber 31 and a gas flow hardly exists in the cleaning chamber 31.

Figure 8:
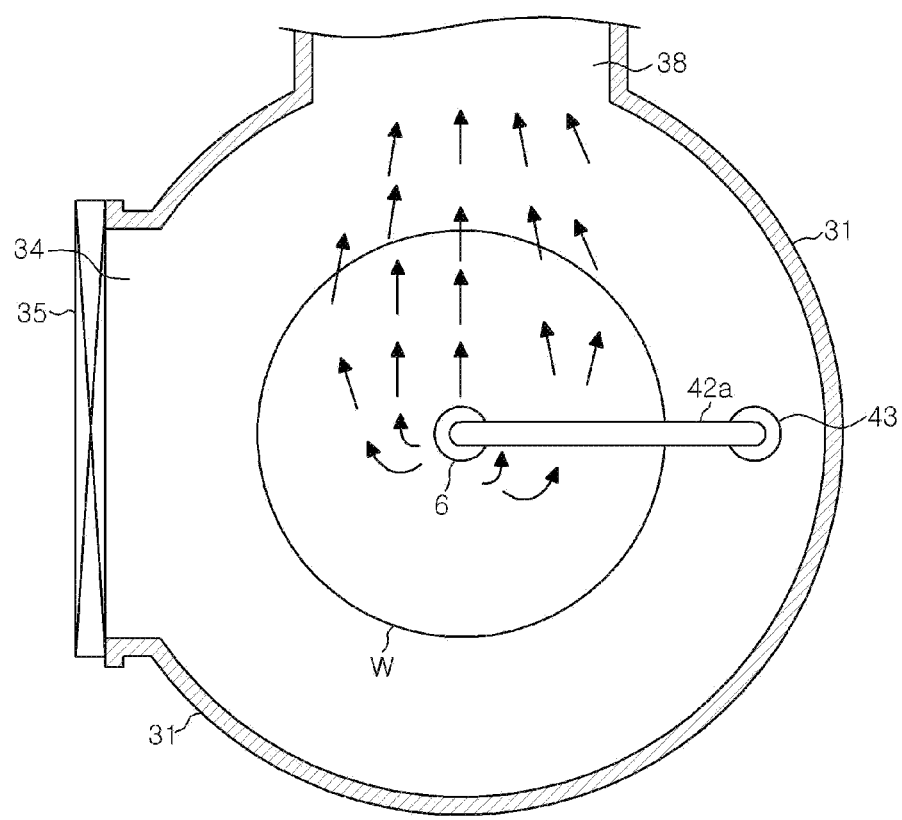
FIG. 8 is a diagram for explaining a gas flow after irradiation of a gas cluster.

However, a gas for generating a gas cluster has a high pressure and a high concentration. Therefore, if the gas cluster is irradiated to the wafer W, an area where the gas density is locally high is generated near the gas cluster irradiation area. If the gas in the cleaning chamber 31 is exhausted in this state, a strong gas flow, which is directed from the area where the gas density is locally high toward the gas exhaust port 38, is generated as shown in FIG. 8. According to the flow velocity distribution of the gas flow obtained by simulation using thermal fluid analysis software (FLUENT Ver. 6.3), after the cleaning gas was ejected from the nozzle unit 6, the speed of the gas flow horizontally flowing along the circumferential direction of the wafer W was 100 m/sec or higher, and the maximum speed was 500 m/sec or higher.

Figure 9:
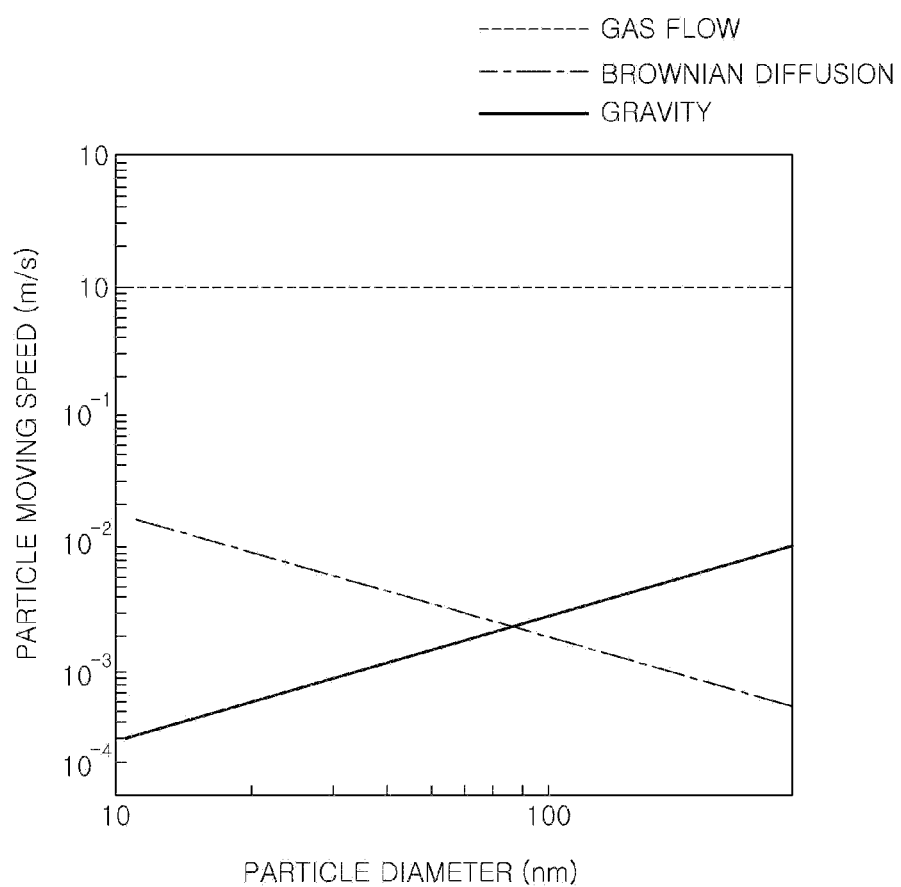
FIG. 9 is a characteristic graph illustrating a result of simulation on a particle moving speed.

Next, based on the above speed, for each particle diameter, moving speeds of particles due to the gas flow, gravity and Brownian diffusion was obtained using simulation based on the theoretical equation. The pressure in the cleaning chamber 31 was set to 25 Pa, and silica particles were used. FIG. 9 shows the result thereof. For example, the speed of the particle 100 having a diameter of about 20 nm by the gravity or the Brownian diffusion is lower than $10^{-2}$ m/sec. On the other hand, the speed of the particle 100 by the gas flow is about 1 m/sec. Therefore, it is clear that the speed of the particle 100 in the horizontal direction by the gas flow is about $10^2$ to $10^3$ times faster than a drop speed by the Brownian diffusion or the gravity.

Accordingly, when the inside of the cleaning chamber is exhausted through the gas exhaust port 38 while irradiating the gas cluster to the wafer W having a diameter of 300 mm, for example, the particles 100 scattered from the wafer W by the irradiation of the gas cluster are trapped by the strong flow of the gas cluster to flow toward the gas exhaust port 38 at a speed much higher than the drop speed of the particles 100. As a consequence, most of the particles 100 captured by the strong flow generated by the gas cluster pass through the space above the wafer W before falling down to the surface of the wafer W.

As can be seen from the simulation result, when the gas cluster is irradiated to the wafer W, the gas flow in the circumferential direction is locally generated at the irradiation area and, thus, the particles 100 are scattered from the wafer W in the circumferential direction about the gas cluster irradiation position. Meanwhile, the gas flow in the cleaning chamber 31 is directed from the gas cluster irradiation position toward the gas exhaust port 38 through which the gas is exhausted, as shown in FIG. 8. Accordingly, among the particles 100 scattered from the wafer W by the irradiation of the gas cluster, the particles 100 scattered from the gas cluster irradiation position toward the gas exhaust port 38 are mostly trapped by the gas flow to be exhausted together with the gas flow. However, the particles 100 that are not trapped by the gas flow fall down by the gravity.

In the above embodiment, when seen from the center C of the cleaning chamber 31, the gas exhaust port 38 is positioned in an area between the straight lines L1 and L2 obtained by rotating the straight line L at an angle of 45° rightward and leftward, the straight line L being drawn from the center C of the cleaning chamber 31 through the central portion P of the irradiation area. The irradiation area of the nozzle unit 6 has a circular arc shape that connects the rotation center and the peripheral portion of the wafer W. The rotation center of the wafer W is provided substantially at the same position as the center C of the cleaning chamber 31. Therefore, when seen from the rotation center of the wafer W, the irradiation area of the nozzle unit 6 is positioned at the same side as the gas exhaust port 38.

The travel distance of the particle from the gas cluster irradiation position until it comes out of the wafer W is increased as the distance between the irradiation position and the gas exhaust port 38 is increased. Therefore, the amount of particles 100 which are re-adhered to the wafer W without being trapped by the gas flow is increased as the distance between the gas cluster irradiation position and the gas exhaust port 38 is increased. As will be described in a test example to be described later, if the distance between the gas exhaust port 38 and the gas cluster irradiation position becomes twice, the re-adhesion rate of the particles separated by the gas cluster irradiation becomes twice. This shows that although the particles separated by the gas cluster irradiation flow due to the gas flow, if the travel distances of the particles from the separation position until they come out of the wafer W are increased, the re-adhesion rate of the particles is increased. In other words, the re-adhesion rate of the particles is determined by the travel distance of the particles. Therefore, when the irradiation area of the nozzle unit 6 is opposite to the side where the gas exhaust port 38 is installed with respect to the center of the wafer W, the distance from the gas cluster irradiation position to the gas exhaust port 38 is increased, so that the particles 100 scattered from the wafer W by the irradiation of the gas cluster fall down to the surface of the wafer W without being trapped by the gas flow. As a result, the re-adhesion rate of the particles is increased.

On the other hand, when the irradiation area of the nozzle unit 6 is positioned at the side where the gas exhaust port 38 is installed with respect to the center of rotation of the wafer W, the distance between the gas cluster irradiation position and the gas exhaust port 38 is decreased, and the re-adhesion rate of the particles that have been separated and scattered from the wafer W by the irradiation of the gas cluster can be decreased. By providing the gas exhaust port 38 based on the position relationship between the irradiation area of the nozzle unit 6 and the center of the cleaning chamber 31, the possibility in which the particles 100 scattered from the surface of the wafer W by the gas cluster are re-adhered onto the surface of the wafer W is decreased.

In the above embodiment, in the cleaning chamber 31, the nozzle unit 6 is rotated by the rotating arm 42b, and the irradiation area is formed between the central portion and the peripheral portion of the wafer W. The particles are removed by rotating the wafer W mounted on the rotating stage 32. Therefore, the wafer W does not need to be moved in the X and the Y direction, which allows scaling down of the cleaning chamber 31. Further, since the gas cluster is irradiated to the wafer W in a perpendicular direction to the wafer W, collapse of a pattern of recesses 8 can be suppressed in case the pattern of recesses 8 is formed on the wafer W. Furthermore, since the gas exhaust port 38 is provided based on the position relationship between the irradiation area of the nozzle unit 6 and the center of the cleaning chamber 31, the possibility in which the particles scattered from the wafer W by the irradiation of the gas cluster are re-adhered onto the surface of the wafer W is decreased. As a result, particles can be removed with high efficiency.

Figure 10:
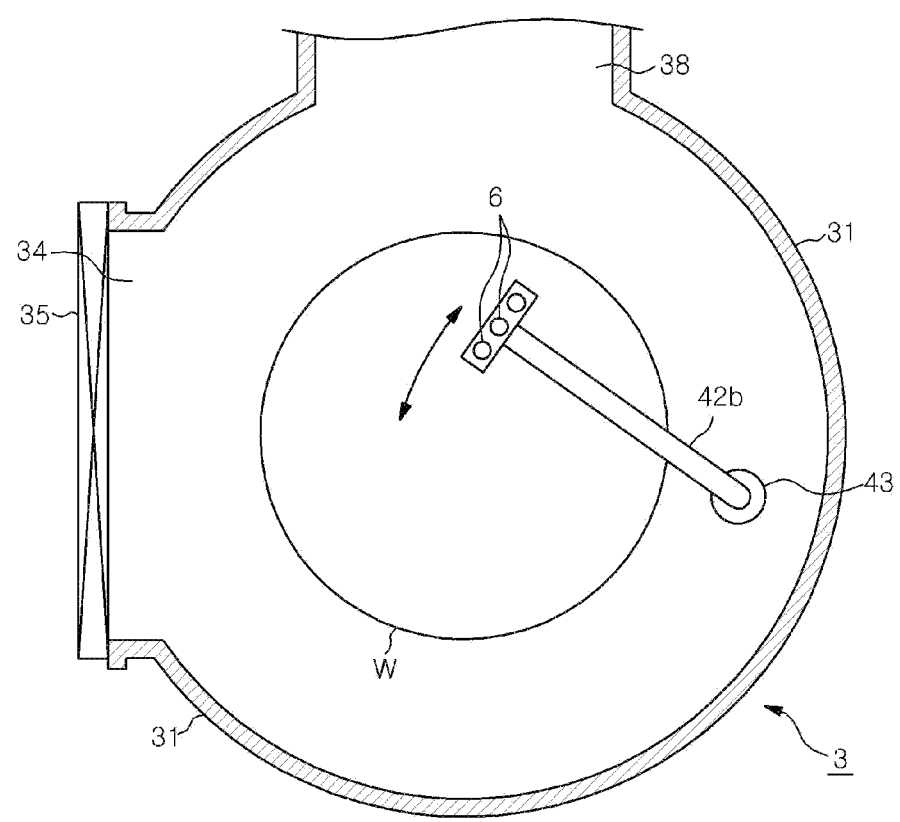
FIG. 10 is a top view schematically showing another example of the substrate cleaning apparatus in accordance with the first embodiment of the present invention.

As for another example of the substrate cleaning apparatus in accordance with the first embodiment of the present invention, there may be suggested an apparatus having a plurality of (three in the example shown in FIG. 10) nozzle units 6 at a leading end of a rotating arm 42b as shown in FIG. 10. In the example shown in FIG. 10, three nozzle units 6 are arranged side by side in a direction perpendicular to the extension direction of the rotating arm 42b. Further, a plurality of, e.g., two, rotating arms may be provided so that the gas cluster can be irradiated to different areas on the surface of the wafer W.

Figure 11:
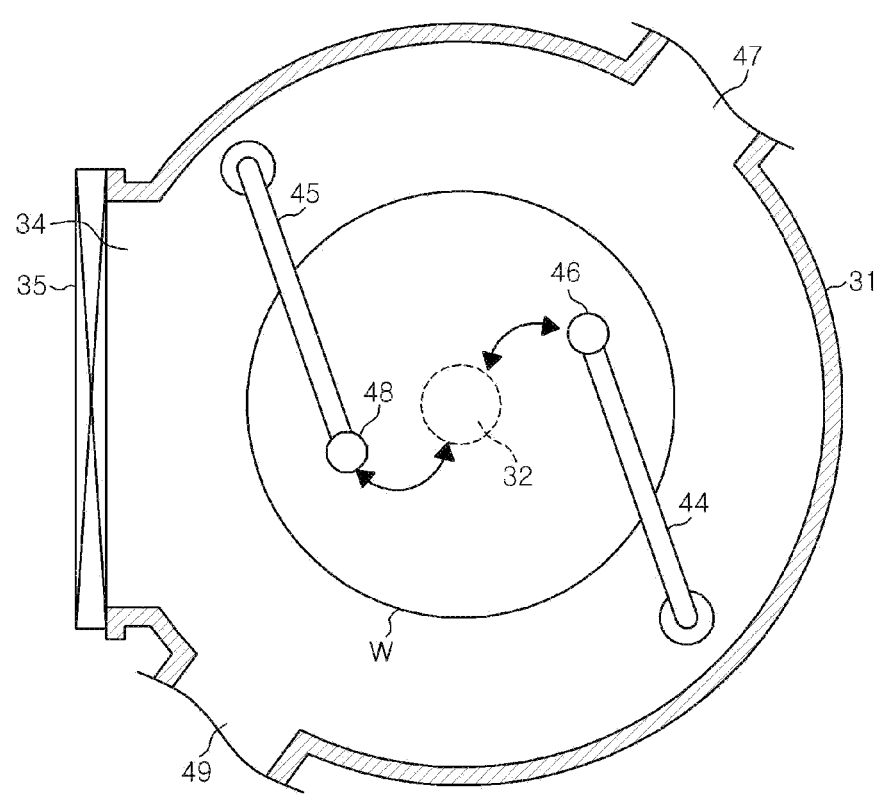
FIG. 11 is a top view schematically showing still another example of the substrate cleaning apparatus in accordance with the first embodiment of the present invention.

For example, as shown in FIG. 11, a rotating arm 44 is provided at a position obtained by rotating the rotating arm 42b in the cleaning module of the first embodiment at an angle of 45° in the clockwise direction about the center of the cleaning chamber 31, and a rotating arm 45 is arranged symmetrically to the rotating arm 44 with respect to the center of the wafer W. The rotating arms 44 and 45 are provided with nozzle units 46 and 48, respectively. Gas exhaust ports 47 and 49 may be provided to correspond to the nozzle units 46 and 48, respectively. In this example, the gas cluster irradiation areas are the irradiation areas of the nozzle units 46 and 48, and the gas exhaust ports 47 and 49 are provided to correspond to the irradiation areas based on the method for determining the layout shown in FIG. 6.

Figure 12:
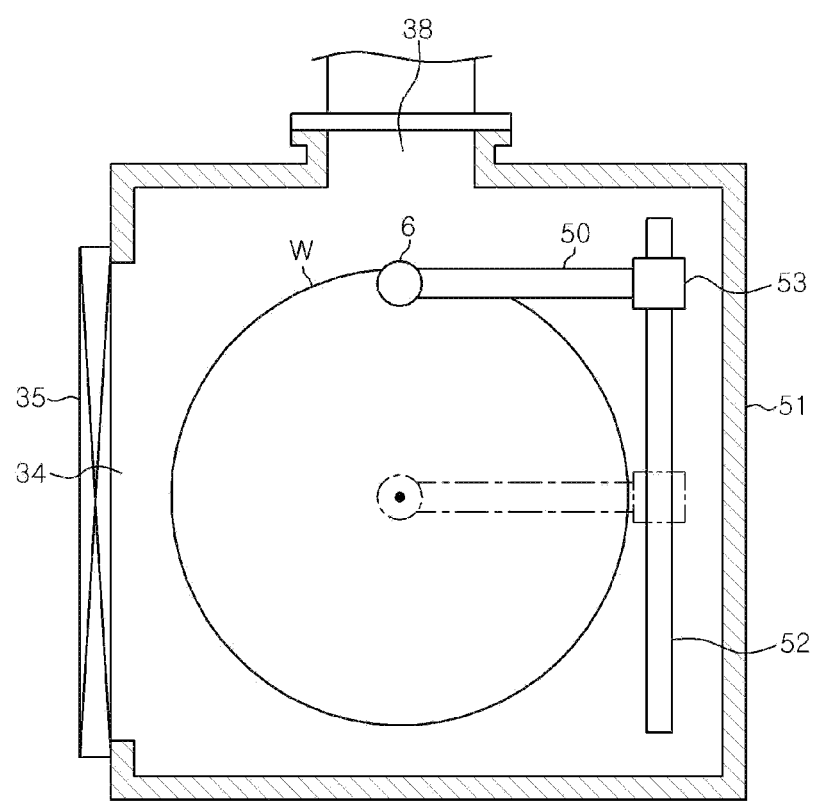
FIG. 12 is a top view schematically showing further still another example of the substrate cleaning apparatus in accordance with the first embodiment of the present invention.

FIG. 12 shows another modification of the substrate cleaning apparatus in accordance with the first embodiment of the present invention. In this example, the supporting arm 50 having the nozzle unit 6 is moved along a guide rail 52 extending to the bottom surface of a cleaning chamber 51 having a rectangular shape, for example, by a moving unit 53. The irradiation area of the nozzle unit 6 which is provided at the leading end of the supporting arm 50 extends straight from the center toward the periphery of the wafer W mounted on the rotating stage 32. The gas exhaust port 38 is provided at the position corresponding to the irradiation area of the nozzle unit 6. With this configuration as well, the same effects are obtained by irradiating the gas cluster while rotating the wafer W.

A particle inspection device may be connected to the atmospheric transfer chamber 13 shown in FIG. 1. In this case, the position information of particles adhered to the surface of the wafer W is acquired by the particle inspection device, and the gas cluster can be locally irradiated toward the particle adhesion position on the surface of the wafer W based on the particle position information by the control unit 9. Further, the substrate cleaning apparatus of the present invention may be provided separately in the form of a so-called stand-along substrate cleaning apparatus instead of being provided in the vacuum processing apparatus shown in FIG. 1. In addition, the cleaning gas ejected from the nozzle unit 6 may be collected and re-used. For example, the gas exhausted through the gas exhaust port 38 and discharged by the vacuum pump may be collected and used for refining He gas, and the refined He gas may be used as a cleaning gas.

Second Embodiment

Figure 13:
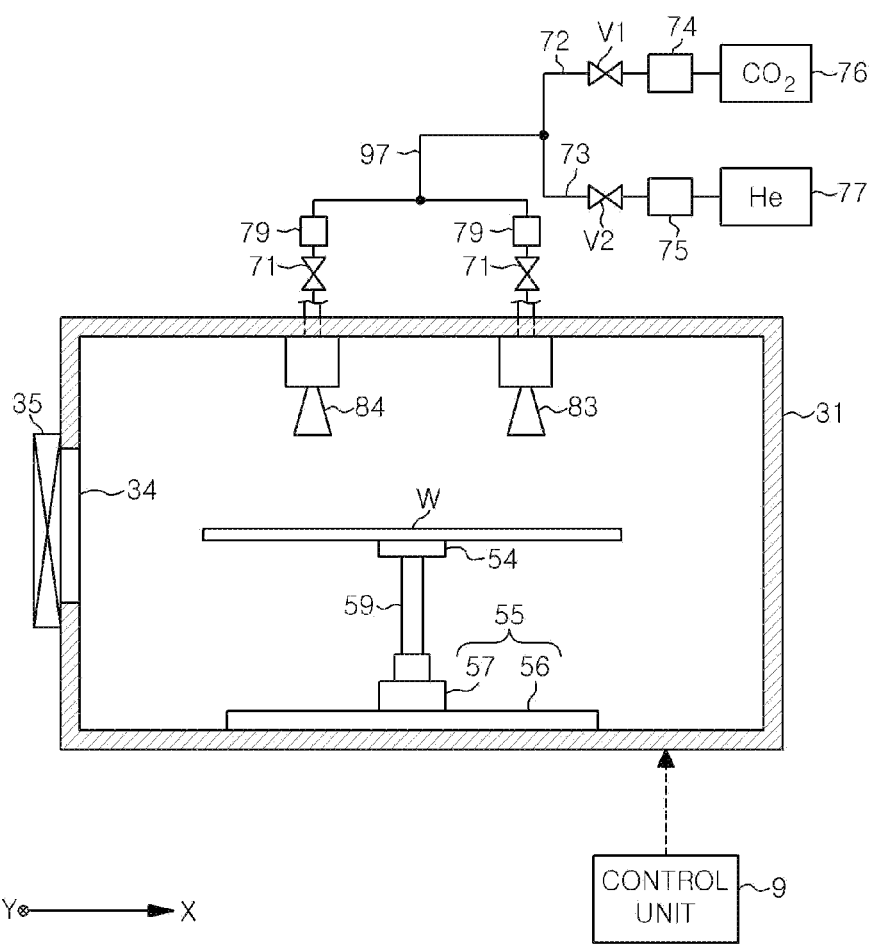
FIG. 13 is a vertical cross sectional view schematically showing a configuration of a substrate cleaning apparatus in accordance with a second embodiment of the present invention.
Figure 14:
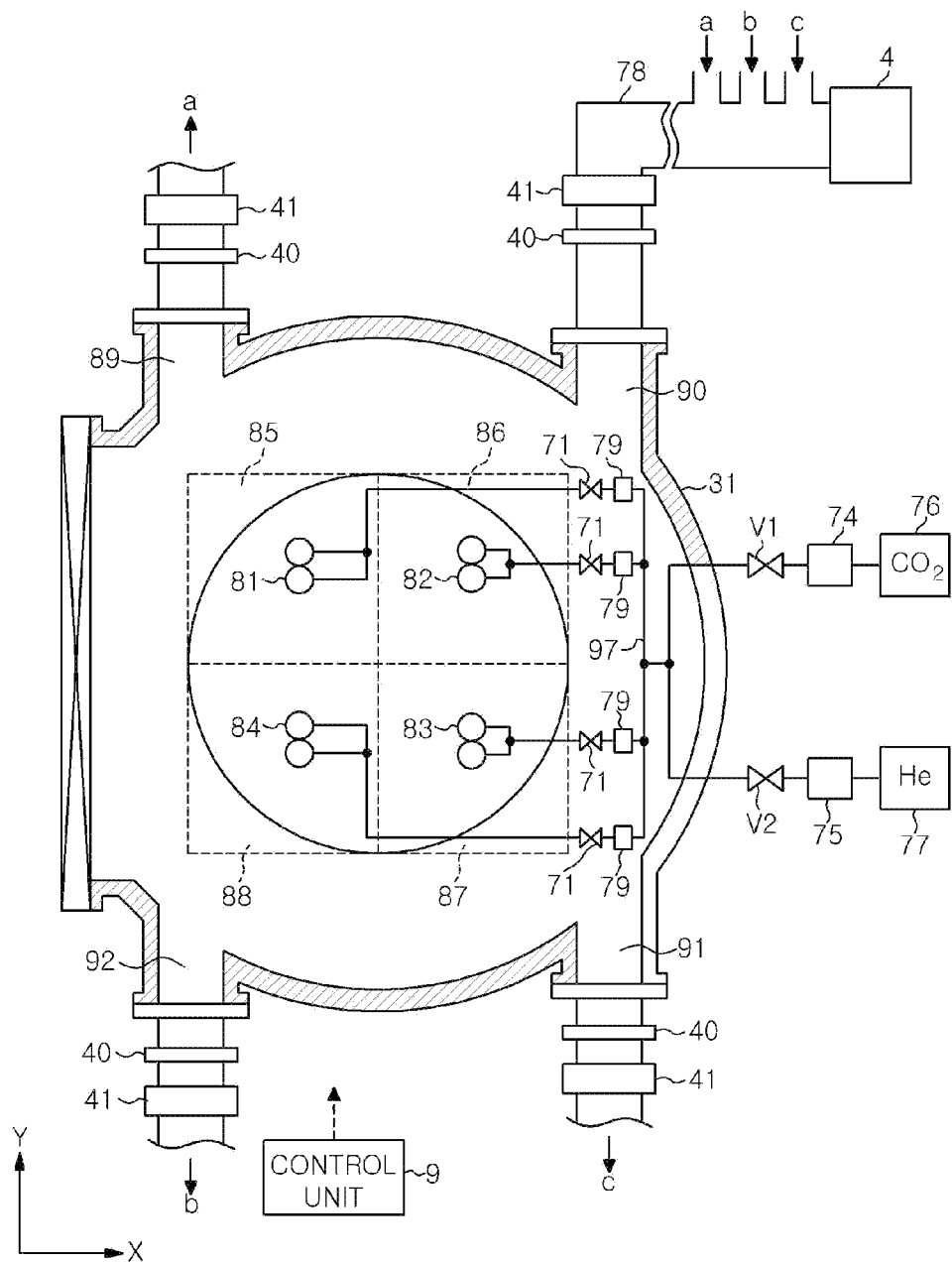
FIG. 14 is a top view schematically showing the configuration of the substrate cleaning apparatus in accordance with the second embodiment of the present invention.

FIGS. 13 and 14 show a substrate cleaning apparatus in accordance with a second embodiment of the present invention. In this example, a mounting table 54 serving as a mounting unit is provided in the cleaning chamber 31. A driving unit 55 serving as a moving unit is provided below the mounting table 54. The driving unit 55 includes: a Y-direction driving unit 57 for moving a supporting column 59 from the front side toward the rear side (Y-axis direction) of the paper surface of FIG. 13; and an X-direction driving unit 56 for moving the Y-direction driving unit 57 from the transfer port of the cleaning chamber 31 toward the opposite side thereto (X-axis direction). Accordingly, the mounting table 54 can be moved in the X and the Y direction by the driving unit 55. The driving unit 55 includes an elevation mechanism, and the mounting table 54 can be vertically moved.

Four nozzle groups 81 to 84, each including two nozzle units 6, are provided at a central portion of the ceiling wall of the cleaning chamber 31 in the following layout. A square having four sides extending in the X and the Y direction and including the cleaning target surface of the wafer W, i.e., the entire surface of the wafer W in this example, is divided into four areas while setting the center of the cleaning chamber 31 as the center of the space when seen from the top. The nozzle groups 81 to 84 are assigned to the respective four areas. In this example, the central portion of the cleaning chamber 31 is a central portion of a circle having a circular arc formed by the inner peripheral surface of the cleaning chamber 31 except the transfer port 34. The two nozzle units 6 included in each of the nozzle groups 81 to 84 are arranged in the Y direction such that there is no gap between the gas cluster irradiation areas. The planar position relationship between each of the divided areas and each of the nozzle groups 81 to 84 is the same in the four divided areas.

In this example, the center of each of the nozzle groups 81 to 84 is positioned at the center of the corresponding divided area. When the wafer W as a cleaning target has a diameter of 300 mm, one side of the square is set to 300 mm in length. In other words, in this case, one side of each of the divided square areas corresponds to the radius of the wafer W. The diameter of the wafer W, i.e., 300 mm, has a manufacturing tolerance, so that the sides of the square including the four areas have a dimension in consideration of the manufacturing tolerance.

Figure 19:
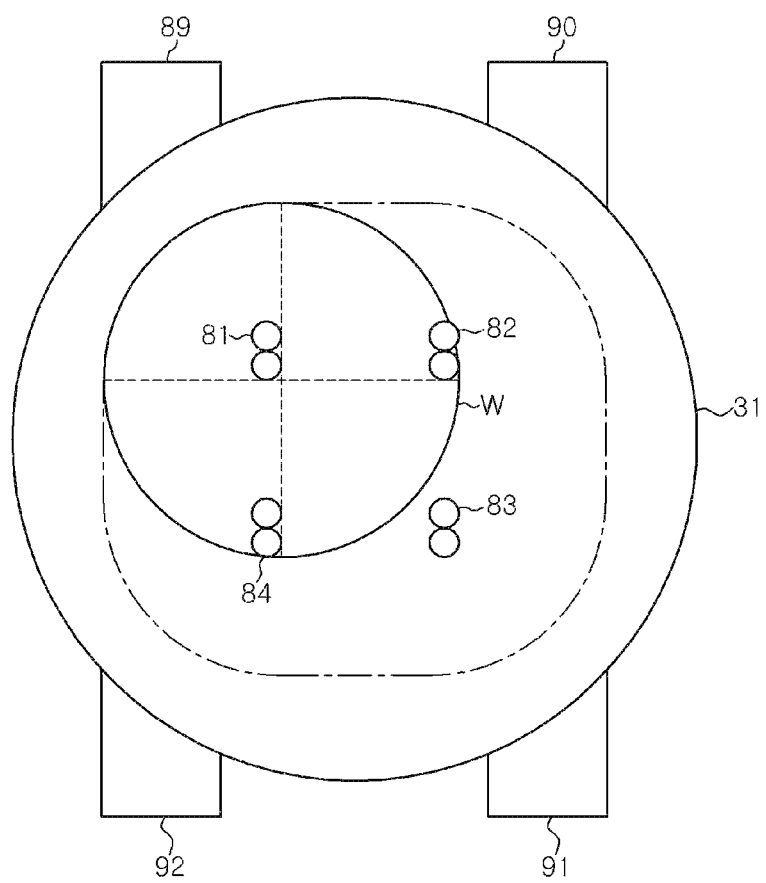
FIG. 19 is a diagram for explaining a wafer moving area during the cleaning process.

With the above arrangement of the nozzle groups 81 to 84, when one of the divided areas is scanned by the gas cluster irradiation area of one of the nozzle groups (e.g., the nozzle group 81) which corresponds thereto by moving the mounting table in the X and the Y direction, the other three divided areas are also scanned by the nozzle groups 82 to 84 corresponding thereto. Here, the irradiation area refers to an area to which the gas cluster is irradiated regardless of the generation of gas cluster. Since each of the nozzle groups 81 to 84 is arranged at the center of each of the areas, the moving area of the wafer which is required for allowing the irradiation areas to scan the entire surface of the wafer becomes an area indicated by a chain line in FIG. 19. Such an area has a substantially square shape having one side of 450 mm (300+((150/2)×2)) which is obtained by adding the diameter of the wafer W to twice of a half of one side of one of the divided square areas, four corners of the substantially square shape having an arc contour. In the following specification, the first nozzle group 81 to the fourth nozzle group 84 are sequentially set in the clockwise direction from the nozzle group installed at the left upper portion in FIG. 14. The divided areas corresponding to the first nozzle group 81 to the fourth nozzle group 84 are set to a first divided area 85 to a fourth divided area 88.

A reference numeral 97 in the drawings denotes a gas supply line for supplying a gas to the first to the fourth nozzle group 81 to 84. The gas supply line 97 has one end branched into four parts. Each of the branched gas supply lines 97 is also branched into two parts respectively connected to two nozzle units 6 of each of the first to the fourth groups 81 to 84. The other end of the gas supply line 97 is branched into two parts, i.e., the first and the second gas supply line 72 and 73. The first gas supply line 72 is connected to the $CO_2$ gas supply source 76. The second gas supply line 73 is connected to the He gas supply source 77. A reference numeral 71 denotes an opening/closing valve; a reference numeral 79 denotes a flow rate control valve; and reference numerals 74 and 75 denote flow rate control units.

In the cleaning chamber 31, a first to a fourth gas exhaust port 89 to 92 are provided. The position relationships between the first nozzle group 81 and the first gas exhaust port 89, between the second nozzle group 82 and the second gas exhaust port 90, between the third nozzle group 83 and the third gas exhaust port 91 and between the fourth nozzle group 84 and the fourth gas exhaust port 92 are set to the position relationship described in FIG. 6. Here, the first to the fourth gas exhaust port 89 to 92 are set in the clockwise direction from the gas exhaust port installed at the left upper portion in FIG. 13. The first to the fourth gas exhaust port 89 to 92 are connected to the vacuum pump 4 through the gas exhaust line 78. A reference numeral 40 in the drawing denotes a pressure control valve. A reference numeral 41 denotes an opening/closing valve.

Figure 15:
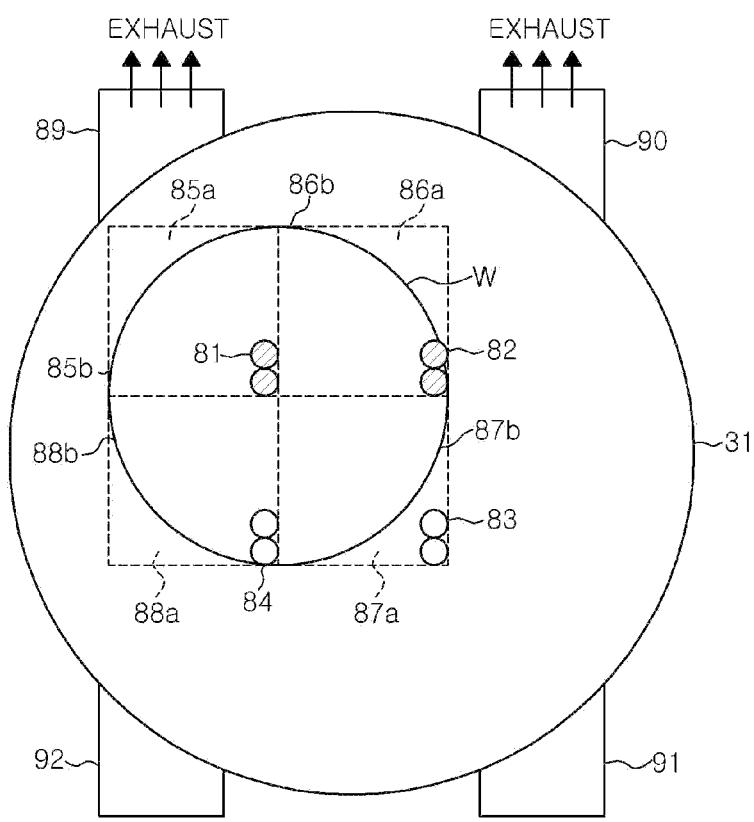
FIG. 15 is a diagram for explaining a wafer cleaning starting position.

Next, an operation of the second embodiment will be described. In the description of the cleaning process in FIG. 15 and the following drawings, the circular cleaning chamber 31 is illustrated. Further, the nozzle unit 6 is exaggerated in size in the drawings. First, the wafer W is mounted on the mounting table 54 of the cleaning module 3 in a vacuum atmosphere and, then, the position of the mounting table 54 is adjusted. Hence, the irradiation positions of the first and the second nozzle group 81 and 82 are positioned at right lower sides of the first and the second divided area 85 and 86 which correspond to the cleaning starting positions, as shown in FIG. 15, for example. In FIGS. 15 to 18 and 20, shaded nozzle groups represent nozzle groups for ejecting a cleaning gas.

The vacuum evacuation is performed through the first and the second gas exhaust port 89 and 90. The cleaning gas is ejected from the first and the second nozzle group 81 and 82.

Figure 16:
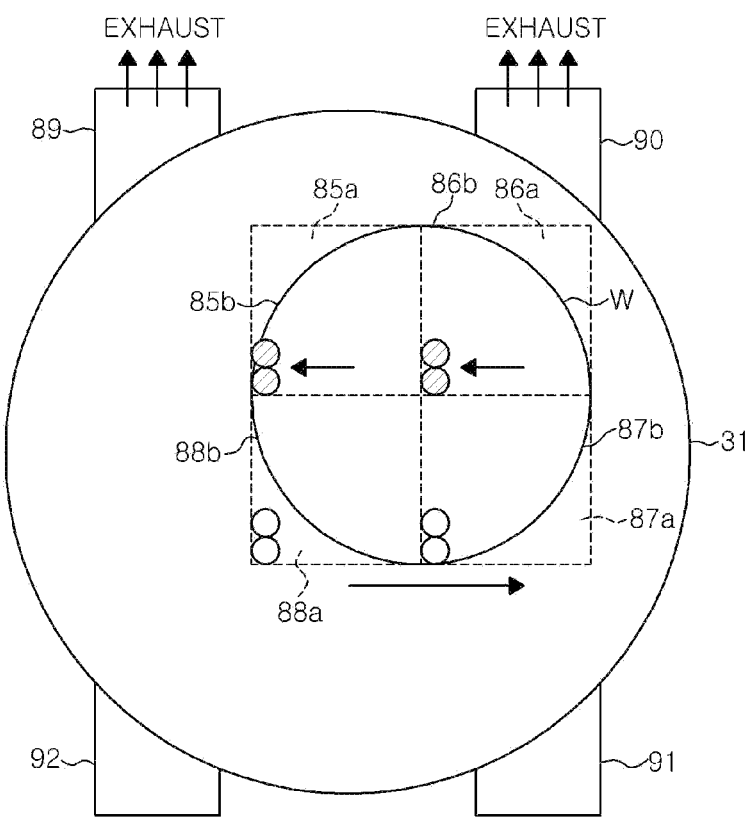
FIG. 16 is a diagram for explaining movement of a wafer and movement of an irradiation area during the cleaning process.
Figure 17:
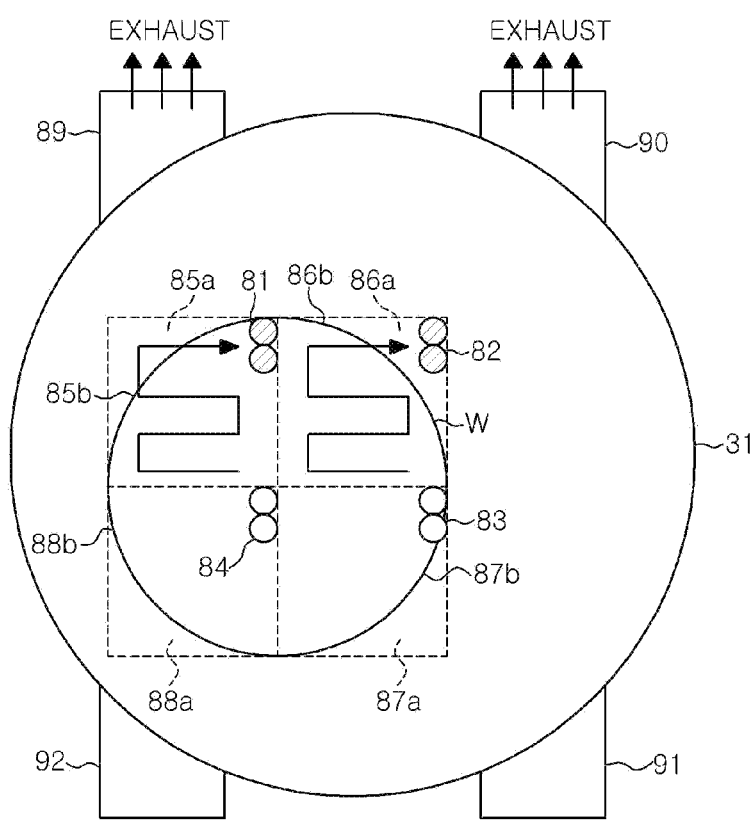
FIG. 17 is a diagram for explaining a cleaning process for a first and a second divided area.

Next, in a state where the cleaning gas is ejected from the first and the second nozzle group 81 and 82, the wafer W is moved to the right side in the drawing, as shown in FIG. 16. At this time, the irradiation positions of the first and the second nozzle group 81 and 82 on the surface of the wafer W are shifted to the left side by the moving distance of the wafer W. By moving the wafer W in the X and Y direction as approximately indicated by arrows in FIG. 17, a square area 85a as the moving area of the wafer W which corresponds to the first area 85 is scanned by the irradiation area of the first nozzle group 81. The moving area of the wafer W which corresponds to the divided areas is a square area that is shifted along with the wafer W in the area where the four divided areas are projected on the moving surface of the wafer W when aligning the center of the wafer W with the center of the cleaning chamber 31. In other words, it is a square area including quadrant areas obtained by dividing the wafer W into four parts. The term "the moving area of the wafer W" is used for easy understanding.

Hereinafter, the scanning of the irradiation area of the first nozzle group 81 will be described in detail. The square area 85a corresponding to the first divided area 85 is scanned by the irradiation area of the first nozzle groups 81 along the X direction, and the scanning zone is sequentially shifted along the Y direction. At this time, the square area 86a corresponding to the second divided area 86 is scanned by the irradiation area of the second nozzle groups 82.

Figure 18:
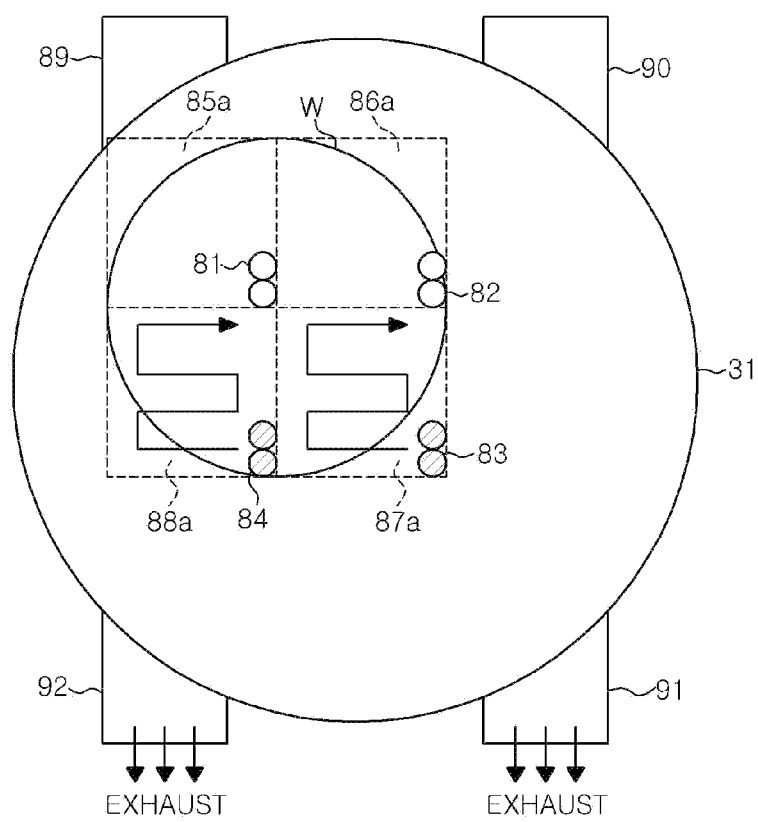
FIG. 18 is a diagram for explaining a cleaning process for a third and a fourth divided area.

After the square areas 85a and 86a respectively corresponding to the first and the second divided area 85 and 86 are scanned, the wafer W returns to the starting position for starting irradiation on the square areas 85a and 86a. Further, the nozzle group for irradiating the gas cluster is switched to the third and the fourth nozzle group 83 and 84, and the gas exhaust port for performing exhaust is switched to the third and the fourth gas exhaust port 91 and 92. Next, the irradiation of the gas cluster from the third and the fourth nozzle group 83 and 84 is started, and the wafer W is moved in the same manner as that as in the case of cleaning the square areas 85a and 86a. Accordingly, as shown in FIG. 18, the square area 87a corresponding to the third divided area 87 is scanned by the irradiation area of the third nozzle groups 83, and the square area 88a corresponding to the fourth divided area 88 is scanned by the irradiation area of the fourth nozzle groups 84.

A quadrant area 86b on the wafer W which corresponds to the second divided area 86 is cleaned when the gas cluster is irradiated to the square area 85a corresponding to the first divided area 85. Further, in the case of cleaning the quadrant areas 87b and 88b on the wafer W which respectively correspond to the third and the fourth divided area 87 and 88, the wafer W is moved in the same manner as that in the case of cleaning the quadrant areas 85b and 86b respective corresponding to the first and the second divided area 85 and 86. By setting the moving area of the wafer W to a range where the square area 85a corresponding to the first divided area 85 can be scanned by the irradiation area of the first nozzle group 81, the gas cluster can be irradiated to the entire surface of the wafer W. At this time, the wafer W is moved within an area indicated by the chain line in FIG. 19 from the start to the completion of the cleaning.

In the second embodiment as well, when the gas cluster is irradiated to the surface of the wafer W, the moving area of the wafer W is reduced and, thus, the cleaning chamber 31 can be scaled down. Since the gas cluster is irradiated to the wafer W in a direction perpendicular to the wafer W, pattern collapse can be suppressed in case a recessed pattern is formed on the wafer.

Figure 20:
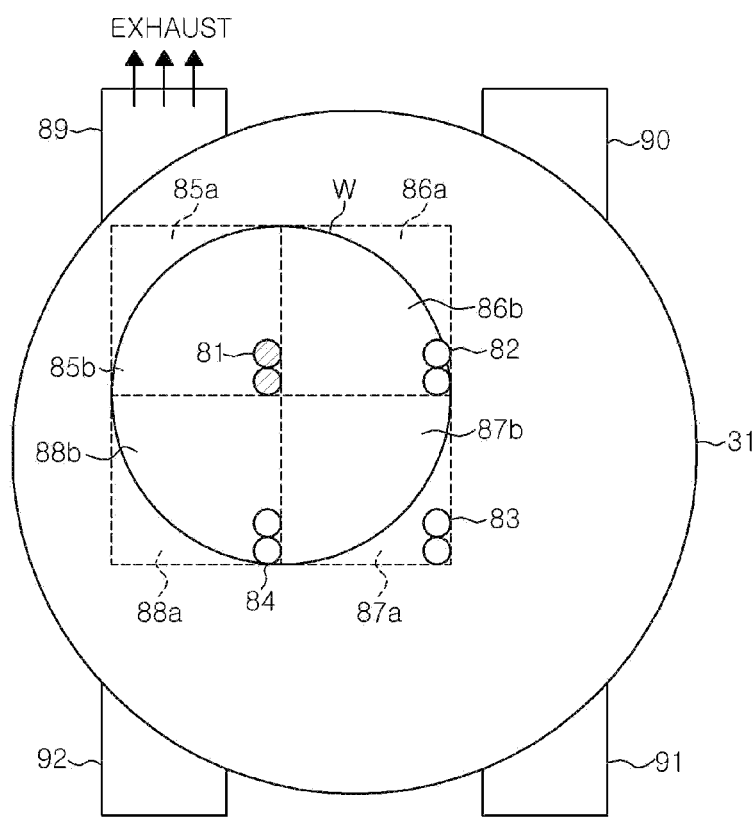
FIG. 20 is a diagram for explaining another example of a substrate cleaning apparatus in accordance with a second embodiment of the present invention.

In addition, the quadrant areas 85b to 88b on the wafer W which correspond to the first to the fourth divided areas 85 to 88 may be sequentially cleaned by irradiating the gas cluster from one of the nozzle groups. In this case, when the gas cluster is irradiated by the first nozzle groups 81 as shown in FIG. 20, for example, the exhaust is performed through the first gas exhaust port 89. Then, the quadrant area 85b on the wafer W which corresponds to the first divided area 85 is scanned by the irradiation area of the first nozzle group 81. Next, the wafer W is returned to the cleaning starting position of the first divided area 85, and the irradiation of the gas cluster from the first nozzle group 81 is stopped and the irradiation of the gas cluster from the second nozzle group 82 is started. At the same time, the gas exhaust port for performing exhaust is switched from the first gas exhaust port 89 to the second gas exhaust port 90. Then, the wafer W is moved such that the gas cluster can be irradiated to the quadrant area 86b on the wafer W which corresponds to the second divided area 86.

Thereafter, the quadrant area 87b on the wafer W which corresponds to the third divided area 87 is cleaned by the third nozzle groups 83 while performing exhaust through the third gas exhaust port 91. Then, the quadrant area 88b on the wafer W which corresponds to the fourth divided area 88 is cleaned by the fourth nozzle groups 84 while performing exhaust through the fourth gas exhaust port 92. In this configuration as well, the moving area for cleaning the entire surface of the wafer W is set to a range where the square area 85a can be scanned by the first nozzle group 81. Therefore, the cleaning chamber 31 can be scaled down.

Figure 21:
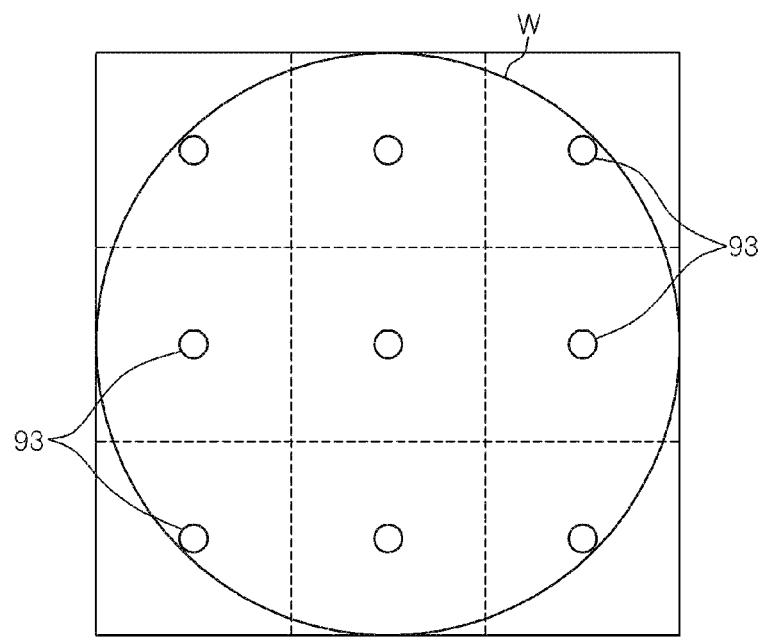
FIG. 21 is a diagram for explaining still another example of the substrate cleaning apparatus in accordance with the second embodiment of the present invention.

The surface of the wafer W is not necessarily divided into four parts. For example, nozzle groups 93 are respectively assigned to nine areas obtained by dividing a square including an entire cleaning target surface of the wafer W and having four sides extending in the X and Y direction into nine parts. The divided areas and the nozzle groups 93 are arranged such that the same planar position relationship is realized. For example, as shown in FIG. 21, the centers of the nozzle groups 93 are respectively positioned at the centers of the divided areas. In this case, one side of the divided square area is approximately ⅓ of the diameter of the wafer W.

In this configuration as well, when a square area corresponding to one of the divided areas is scanned by a gas cluster irradiation area of one of the nozzle groups which corresponds thereto, the other divided areas are scanned by the irradiation areas of the nozzle groups corresponding thereto. In this case, the irradiation area indicates gas cluster irradiation area not gas cluster generation area. Accordingly, the moving area of the wafer W can be reduced, and the cleaning chamber 31 can be scaled down.

Third Embodiment

Figure 22:
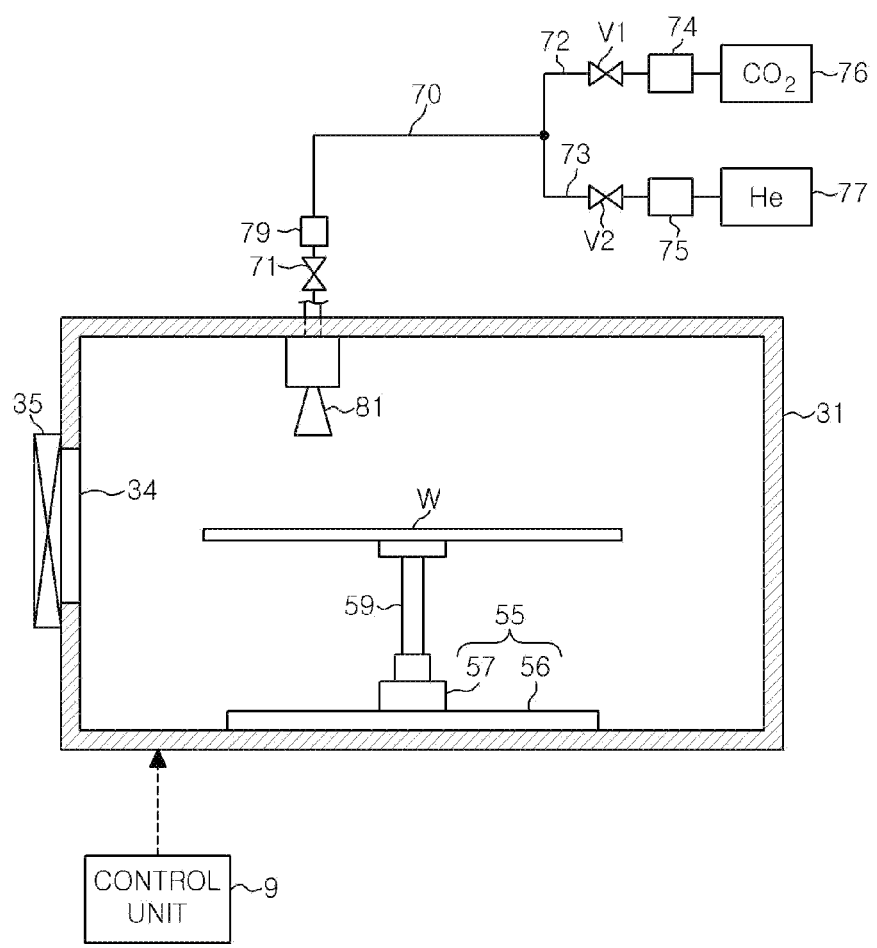
FIG. 22 is a vertical cross sectional view schematically showing a substrate cleaning apparatus in accordance with a third embodiment of the present invention.
Figure 23:
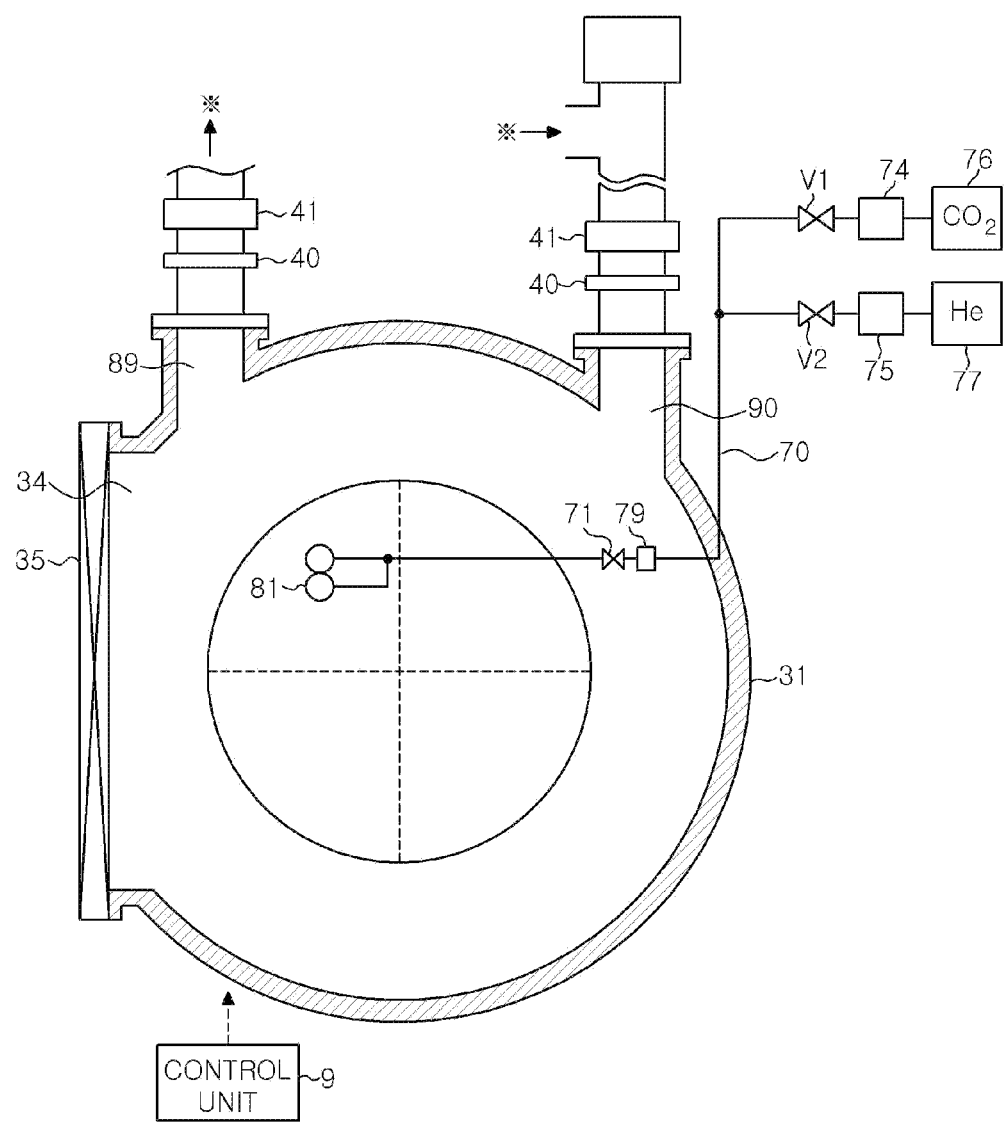
FIG. 23 is a top view schematically showing the substrate cleaning apparatus in accordance with the third embodiment of the present invention.

FIGS. 22 and 23 show the substrate cleaning apparatus in accordance with a third embodiment of the present invention. The substrate cleaning apparatus of the third embodiment is different from the substrate cleaning apparatus shown in FIGS. 13 and 14 in that only the first nozzle group 81 is provided and the second to the fourth nozzle group 82 to 84 are omitted. When the center of the wafer W is positioned at the center of the cleaning chamber 31, the first nozzle group 81 is positioned at the center of the square area 85a corresponding to the first divided area 85. Further, the mounting table 54 has a rotation shaft 60 instead of the supporting column 59, and the rotation shaft 60 is connected to a rotation unit moved by the Y-direction driving unit 57 provided at the driving unit 55. Therefore, the mounting table 54 can be moved in the X and the Y direction, and the rotation shaft 60 can rotate about the vertical axis. The cleaning chamber 31 has a configuration in which the third and the fourth gas exhaust port 91 and 92 are omitted.

Figure 24:
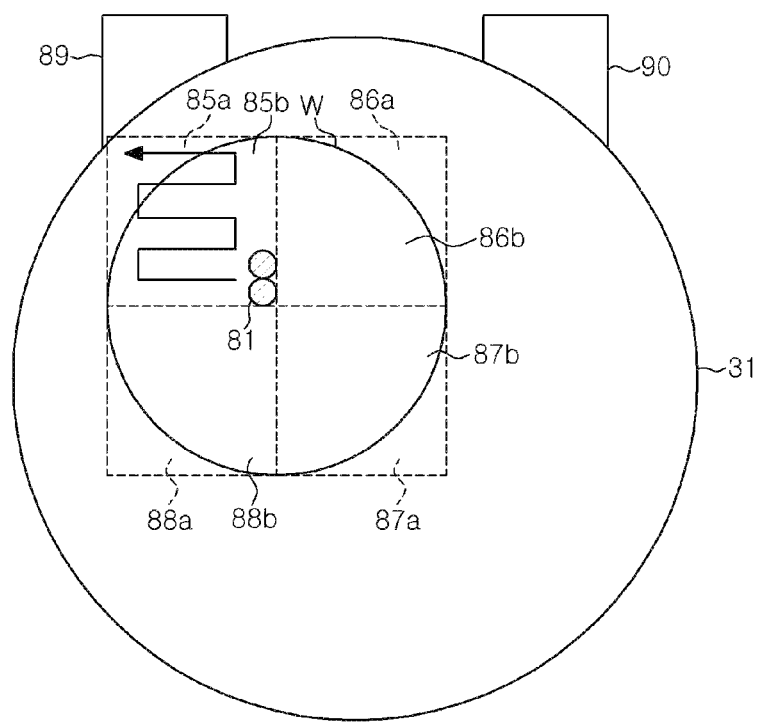
FIG. 24 is a diagram for explaining a cleaning process of the substrate cleaning apparatus in accordance with the third embodiment of the present invention.

In this configuration, as shown in FIG. 24, the vacuum atmosphere is obtained by performing exhaust through the first and the second gas exhaust port 89 and 90 and, then, the wafer W is moved to the cleaning starting position. Next, the quadrant area 85b on the wafer W which corresponds to the first divided area 85 is scanned by the irradiation area of the first nozzle group 81 while moving the wafer W in the X and the Y direction. Thereafter, the wafer W is rotated by 90° in a counterclockwise direction, for example. Accordingly, the quadrant area 86b on the wafer W which corresponds to the second divided area 86 is moved to the position corresponding to the first nozzle group 81. Then, by moving the wafer W in the X and the Y direction to allow the quadrant area 86b to be scanned by the irradiation area of the first nozzle group 81 in the same manner. As a consequence, the gas cluster is irradiated to the second divided area 86.

In this case, when the irradiation area of the first nozzle group scans the wafer W from the inner side toward the peripheral side of the wafer W, the irradiation area of the first nozzle group may be stopped at the peripheral side of the wafer W and moved upward, and then moved from the peripheral side toward the inner side of the wafer W. Thereafter, the wafer W is rotated by 90°, and the gas cluster is irradiated to the square area 87a corresponding to the third divided area 87. Next, the wafer W is rotated by 90°, and the gas cluster is irradiated to the square area 88a corresponding to the fourth divided area 88. Further, the exhaust between the cleaning processes is executed through the first and the second gas exhaust port 89 and 90. In this configuration as well, the moving area of the wafer W can be reduced, and the cleaning chamber 31 can be scaled down.

In the third embodiment, the wafer W is divided into four areas where the irradiation area of the nozzle group is scanned by moving the wafer W in the X and Y direction in the above example. However, the wafer W may be divided into two or three or more than four.

In the above, the substrate to be cleaned may be a rectangular substrate without being limited to the wafer W.

(Evaluation Test)

In order to evaluate the present invention, the re-adhesion rate of particles and the travel distance of particles from the gas cluster irradiation position until they come out of the periphery the wafer W were examined. In the test, the substrate cleaning apparatus shown in FIG. 3 was used.

In a test example, the irradiation position of the gas cluster was fixed to the gas exhaust port 38 side when seen from the center of the wafer W. In a comparative example, the irradiation position of the gas cluster was fixed to the side opposite to the side where the gas exhaust port 38 is installed when seen from the center of the wafer W. The distance between the irradiation position and the gas exhaust port 38 in the comparative example was set to be twice greater than that in the test example. In both of the test example and the comparative example, particles were adhered to the irradiation area of the gas cluster and removed by irradiating the gas cluster. Moreover, in both of the test example and the comparative example, the ratio of particles n1 re-adhered to the surface of the wafer W to the number n of the original particles (re-adhesion rate: (n1/n)×100) was measured.

Figure 25:
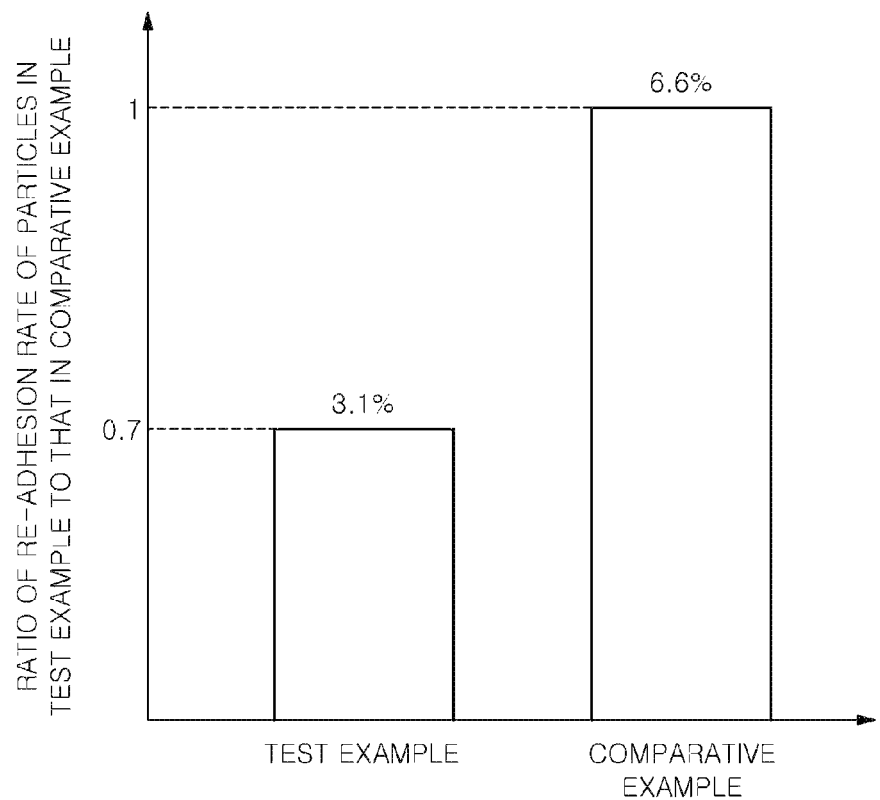
FIG. 25 is a characteristic diagram showing characteristics of a substrate cleaning apparatus in a test example.

FIG. 25 is a characteristic diagram showing the result, i.e., the re-adhesion rates of particles in the test example and the comparative example and a ratio of the re-adhesion rate in the test example to that in the comparative example.

According to this result, the re-adhesion rate of the particles in the comparative example is twice greater than that in the test example. Therefore, in the case of removing particles by irradiating the gas cluster, the re-adhesion of particles can be suppressed by providing the gas exhaust port near the irradiation position of the gas cluster on the surface of the wafer.

While the invention has been shown and described with respect to the embodiments, it will be understood by those skilled in the art that various changes and modifications may be made without departing from the scope of the invention as defined in the following claims.

What is claimed is:

1. A substrate cleaning apparatus for removing particles adhered to a substrate, comprising:
a cleaning chamber configured to perform a cleaning process on the substrate under a vacuum atmosphere;
a mounting unit, provided in the cleaning chamber, for mounting the substrate thereon;
at least one nozzle unit configured to eject a cleaning gas toward the substrate in the cleaning chamber, generate a gas cluster as an aggregate of atoms or molecules of the cleaning gas by adiabatic expansion and irradiate the gas cluster to the substrate in a direction perpendicular to the substrate;
a gas exhaust port through which the cleaning chamber is evacuated;
a driving unit connected to a center of the mounting unit through a vertically extended first rotating shaft and configured to rotate the mounting unit;
at least one nozzle-unit moving body including a vertically extended second rotating shaft and a rotating arm extending horizontally from an upper portion of the second rotating shaft and bending toward the mounting table, wherein each nozzle-unit moving body is connected to the at least one nozzle unit; and
a rotation unit connected to the second rotating shaft of the nozzle-unit moving body and configured to rotate the nozzle-unit moving body about a vertical axis extending through a center of the second rotating shaft,
wherein each nozzle unit is moved between a position above a center of the substrate and a position above a periphery of the substrate by rotating the nozzle-unit moving body by the rotation unit.

2. The substrate cleaning apparatus of claim 1, wherein when the nozzle unit is moved, an irradiation area of the gas cluster forms a circular arc shape, and
wherein when seen from the top, the gas exhaust port is positioned outward from the substrate in a horizontal direction and is positioned within an area of the cleaning chamber between two imaginary straight lines defined by rotating an imaginary straight line extending from a center of the cleaning chamber through a center of the irradiation area rightward and leftward by an angle of 45° about the center of the cleaning chamber.

3. The substrate cleaning apparatus of claim 1, wherein each nozzle-unit moving body is connected to a plurality of nozzle units.

4. The at least substrate cleaning apparatus of claim 1, wherein the at least one nozzle-unit moving body comprises a plurality of nozzle-unit moving bodies, each of which is connected to the at least one nozzle unit.

* * * * *